United States Patent
Nakano et al.

(10) Patent No.: US 9,368,616 B2
(45) Date of Patent: Jun. 14, 2016

(54) SEMICONDUCTOR DEVICE

(71) Applicant: ROHM CO., LTD., Kyoto-shi, Kyoto (JP)

(72) Inventors: Yuki Nakano, Kyoto (JP); Ryota Nakamura, Kyoto (JP); Hiroyuki Sakairi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/423,034

(22) PCT Filed: Aug. 14, 2013

(86) PCT No.: PCT/JP2013/071936
§ 371 (c)(1),
(2) Date: Feb. 20, 2015

(87) PCT Pub. No.: WO2014/030589
PCT Pub. Date: Feb. 27, 2014

(65) Prior Publication Data
US 2015/0214355 A1    Jul. 30, 2015

(30) Foreign Application Priority Data
Aug. 20, 2012 (JP) .................. 2012-181897

(51) Int. Cl.
H01L 29/78    (2006.01)
H01L 29/417   (2006.01)
H01L 29/45    (2006.01)
(Continued)

(52) U.S. Cl.
CPC ........ *H01L 29/7813* (2013.01); *H01L 29/0649* (2013.01); *H01L 29/0653* (2013.01); *H01L 29/0847* (2013.01); *H01L 29/41766* (2013.01); *H01L 29/45* (2013.01); *H01L 29/47* (2013.01); *H01L 29/66068* (2013.01); *H01L 29/7806* (2013.01); *H01L 29/1095* (2013.01); *H01L 29/1608* (2013.01)

(58) Field of Classification Search
None
See application file for complete search history.

(56) References Cited

U.S. PATENT DOCUMENTS 8,193,564 B2 * 6/2012 Suzuki ............... H01L 29/0623
257/216
2005/0218472 A1 10/2005 Okada et al.
(Continued)

FOREIGN PATENT DOCUMENTS

JP    2005-285913    10/2005
JP    2008-294210    12/2008
(Continued)

*Primary Examiner* — Alexander Ghyka
(74) *Attorney, Agent, or Firm* — Hamre, Schumann, Mueller & Larson, P.C.

(57) ABSTRACT

The semiconductor device includes: a semiconductor layer in which a trench is formed having a side surface and a bottom surface; a second conductivity-type layer formed on the semiconductor layer on the side surface and the bottom surface of the trench; a first conductivity-type layer formed on the semiconductor layer so as to contact the second conductivity-type layer; a first electrode electrically connected to the first conductivity-type layer; a second electrode embedded in the trench and electrically connected to the second conductivity-type layer; and a barrier-forming layer which is arranged between the second electrode and the side surface of the trench and which, between said barrier-forming layer and the second conductivity-type layer, forms a potential barrier higher than the potential barrier between the second conductivity-type layer and the second electrode.

16 Claims, 20 Drawing Sheets

(51) Int. Cl.
    *H01L 29/47*     (2006.01)
    *H01L 29/66*     (2006.01)
    *H01L 29/06*     (2006.01)
    *H01L 29/08*     (2006.01)
    *H01L 29/16*     (2006.01)
    *H01L 29/10*     (2006.01)

(56) References Cited

U.S. PATENT DOCUMENTS

| | | |
|---|---|---|
| 2010/0078707 A1 | 4/2010 | Haeberlen et al. |
| 2012/0037922 A1 | 2/2012 | Kono et al. |
| 2013/0001681 A1* | 1/2013 | Sin ................ H01L 29/7813 257/330 |
| 2013/0134505 A1* | 5/2013 | Kobayashi ........ H01L 29/66348 257/330 |
| 2013/0306983 A1 | 11/2013 | Nakano et al. |
| 2013/0313576 A1 | 11/2013 | Nakano |
| 2014/0103364 A1* | 4/2014 | Nakano ............... H01L 29/435 257/77 |
| 2014/0264433 A1* | 9/2014 | Hu et al. ........... H01L 29/7395 257/139 |
| 2015/0129893 A1* | 5/2015 | Nakano ............... H01L 29/7813 257/77 |
| 2015/0145025 A1* | 5/2015 | Yoshida .............. H01L 29/0696 257/329 |

FOREIGN PATENT DOCUMENTS

| | | |
|---|---|---|
| JP | 2010-238738 | 10/2010 |
| JP | 2012-59873 | 3/2012 |
| JP | 2012-119559 | 6/2012 |
| WO | WO 2012/105611 | 8/2012 |
| WO | WO 2012/105613 | 8/2012 |

\* cited by examiner

SEMICONDUCTOR DEVICE

TECHNICAL FIELD

The present invention relates to a semiconductor device.

BACKGROUND ART

Attention has heretofore been paid to a semiconductor power device that is used mainly for systems, such as a motor control system and a power conversion system, in various power electronics fields. For example, an SiC semiconductor device is publicly known as this type of semiconductor power device (see Patent Literature 1, for example).

The semiconductor device of Patent Literature 1 includes an SiC substrate, an n type high-resistivity layer formed on the SiC substrate, a p well layer formed on the n type high-resistivity layer, an $n^+$ emitter region formed at a surface part of the p well layer, a $p^+$ contact region that passes through the $n^+$ emitter region and reaches the p well layer, a trench that passes through the p well layer from a surface of the $n^+$ emitter region and reaches the n type high-resistivity layer, a gate oxide film formed at an inner surface of the trench, and a polysilicon gate electrode embedded in the trench.

CITATION LIST

Patent Literature

Patent Literature 1: Japanese Patent Application Publication No. 2008-294210

SUMMARY OF INVENTION

Solution to Problem

The semiconductor device of the present invention includes a semiconductor layer in which a trench having a side surface and a bottom surface is formed, a second conductivity type layer formed in the semiconductor layer on the side surface and the bottom surface of the trench, a first conductivity type layer formed in the semiconductor layer so as to be contiguous to the second conductivity type layer, a first electrode electrically connected to the first conductivity type layer, a second electrode that is embedded in the trench and that is electrically connected to the second conductivity type layer, and a barrier-forming layer that is disposed between the side surface of the trench and the second electrode and that forms a potential barrier between the barrier-forming layer and the second conductivity type layer higher than a potential barrier between the second conductivity type layer and the second electrode.

According to this arrangement, when a reverse bias is applied to a pn junction portion between the first conductivity type layer and the second conductivity type layer, a depletion layer occurring in the pn junction portion spreads toward the trench with respect to the pn junction portion, and is liable to reach the side surface of the trench. However, in this arrangement, it is possible to restrain punchthrough by means of the barrier-forming layer even if the depletion layer reaches the side surface of the trench. As a result, it is possible to restrain the occurrence of a leakage current.

Preferably, the barrier-forming layer is further disposed on an edge portion of the bottom surface of the trench.

According to this arrangement, it is also possible to restrain punchthrough in the edge portion of the bottom surface of the trench.

The barrier-forming layer may include a metal layer made of any one of tungsten (W), platinum (Pt), nickel (Ni), cobalt (Co), and molybdenum (Mo).

Additionally, the barrier-forming layer may include a first conductivity type polysilicon layer.

Additionally, the barrier-forming layer may include an insulating layer made of any one of non-doped polysilicon, silicon oxide ($SiO_2$), aluminum oxide ($Al_2O_3$), and aluminum oxynitride (AlON).

The semiconductor device of the present invention includes a semiconductor layer in which a taper trench having a side surface and a bottom surface is formed such that the side surface is inclined with respect to the bottom surface at an obtuse angle, a second conductivity type layer that is formed in the semiconductor layer on the side surface and the bottom surface of the taper trench and that becomes thicker in a lateral direction along a surface of the semiconductor layer from the side surface corresponding to an inclination of the side surface of the taper trench, a first conductivity type layer formed in the semiconductor layer so as to be contiguous to the second conductivity type layer, a first electrode electrically connected to the first conductivity type layer, and a second electrode that is embedded in the taper trench and that is electrically connected to the second conductivity type layer.

According to this arrangement, a depletion layer is occurred in a pn junction portion between the first conductivity type layer and the second conductivity type layer, and the depletion layer spreads toward the taper trench with respect to the pn junction portion when a reverse bias is applied. At this time, there is a fear that the depletion layer spreading from the pn junction portion will reach the side surface of the trench and will come into contact with the second electrode, and punchthrough will occur if the second conductivity type layer is formed with a constant width in the lateral direction from the side surface of the trench. Therefore, in this semiconductor device, the second conductivity type layer is formed so as to become thicker in the lateral direction corresponding to the inclination of the side surface of the trench. Therefore, it is possible to make the distance between the side surface of the taper trench and the pn junction portion wider than in the former example in which the second conductivity type layer having a constant thickness is formed. This makes it difficult for the depletion layer spreading from the pn junction portion to reach the side surface of the taper trench. As a result, it is possible to restrain punchthrough and is possible to restrain the occurrence of a leakage current.

Preferably, the semiconductor device further includes a barrier-forming layer that is disposed between the side surface of the taper trench and the second electrode and that forms a potential barrier between the barrier-forming layer and the second conductivity type layer higher than a potential barrier between the second conductivity type layer and the second electrode.

According to this arrangement, it is possible to restrain punchthrough by means of the barrier-forming layer even if the depletion layer occurring in the pn junction portion between the first conductivity type layer and the second conductivity type layer spreads toward the taper trench with respect to the pn junction portion and reaches the side surface of the taper trench by means of the application of a reverse bias.

Preferably, the barrier-forming layer is further disposed at on edge portion of the bottom surface of the taper trench.

According to this arrangement, it is also possible to restrain punchthrough in the edge portion of the bottom surface of the taper trench.

The barrier-forming layer may include a metal layer made of any one of tungsten (W), platinum (Pt), nickel (Ni), cobalt (Co), and molybdenum (Mo).

Additionally, the barrier-forming layer may include a first conductivity type polysilicon layer.

Additionally, it may include an insulating layer made of any one of, for example, non-doped polysilicon, silicon oxide ($SiO_2$), aluminum oxide ($Al_2O_3$), and aluminum oxynitride (AlON).

The semiconductor device of the present invention includes a semiconductor layer in which a gate trench having a side surface and a bottom surface and a source trench having a side surface and a bottom surface are formed, a first conductivity type source layer that is disposed so as to be exposed on a surface of the semiconductor layer and that defines the side surface of the gate trench and the side surface of the source trench, a second conductivity type channel layer that is disposed so as to be contiguous to the source layer on a back surface side of the semiconductor layer with respect to the source layer and that defines a part of the side surface of the gate trench and a part of the side surface of the source trench, a first conductivity type drain layer that is disposed so as to be contiguous to the channel layer on the back surface side of the semiconductor layer with respect to the channel layer and that defines the bottom surface of the gate trench and the bottom surface of the source trench, a gate electrode embedded in the gate trench, a gate insulating film disposed between the side and bottom surfaces of the gate trench and the gate electrode, a second conductivity type source breakdown voltage holding layer that is formed so as to be continuous with the channel layer and that is disposed on the side surface and the bottom surface of the source trench, a drain electrode electrically connected to the drain layer, a source electrode that is embedded in the source trench and that is electrically connected to the source layer and to the source breakdown voltage holding layer, and a barrier-forming layer that is disposed between the side surface of the source trench and the source electrode and that has a potential barrier higher than a potential barrier between the source breakdown voltage holding layer and the source electrode.

According to this arrangement, when a reverse bias is applied to a pn junction portion between the second conductivity type source breakdown voltage holding layer and the first conductivity type drain layer, a depletion layer occurred in the pn junction portion spreads toward the source trench with respect to the pn junction portion, and is liable to reach the side surface of the source trench. However, in this arrangement, it is possible to restrain punchthrough by means of the barrier-forming layer even if the depletion layer reaches the side surface of the source trench. As a result, it is possible to restrain the occurrence of a leakage current.

Preferably, the barrier-forming layer is further disposed on an edge portion of the bottom surface of the source trench.

According to this arrangement, it is possible to restrain punchthrough in the edge portion of the bottom surface of the source trench.

Preferably, the barrier-forming layer is disposed such that the source layer is exposed from the side surface of the source trench.

According to this arrangement, it is possible to increase the contact area of the source layer with respect to the source electrode, and hence is possible to secure excellent electrical conductivity between these components.

The barrier-forming layer may include a metal layer made of any one of tungsten (W), platinum (Pt), nickel (Ni), cobalt (Co), and molybdenum (Mo).

Additionally, the barrier-forming layer may include a first conductivity type polysilicon layer.

Additionally, the barrier-forming layer may include an insulating layer made of any one of non-doped polysilicon, silicon oxide ($SiO_2$), aluminum oxide ($Al_2O_3$), and aluminum oxynitride (AlON).

The semiconductor device of the present invention includes a semiconductor layer in which a gate trench having a side surface and a bottom surface and a source trench having a side surface and a bottom surface are formed and in which the source trench is a taper trench whose side surface is inclined with respect to the bottom surface at an obtuse angle, a first conductivity type source layer that is disposed so as to be exposed on a surface of the semiconductor layer and that defines the side surface of the gate trench and the side surface of the source trench, a second conductivity type channel layer that is disposed so as to be contiguous to the source layer on a back surface side of the semiconductor layer with respect to the source layer and that defines a part of the side surface of the gate trench and a part of the side surface of the source trench, a first conductivity type drain layer that is disposed so as to be contiguous to the channel layer on the back surface side of the semiconductor layer with respect to the channel layer and that defines the bottom surface of the gate trench and the bottom surface of the source trench, a gate electrode embedded in the gate trench, a gate insulating film disposed between the side and bottom surfaces of the gate trench and the gate electrode, a second conductivity type source breakdown voltage holding layer that is disposed on the side surface and the bottom surface of the source trench so as to be continuous with the channel layer and that becomes thicker in a lateral direction along the surface of the semiconductor layer from the side surface of the source trench corresponding to an inclination of the side surface of the source trench, a drain electrode electrically connected to the drain layer, and a source electrode that is embedded in the source trench and that is electrically connected to the source layer and to the source breakdown voltage holding layer.

According to this arrangement, a depletion layer is occurred in a pn junction portion between the second conductivity type source breakdown voltage holding layer and the first conductivity type drain layer, and the depletion layer spreads toward the source trench with respect to the pn junction portion when a reverse bias is applied. At this time, there is a fear that the depletion layer spreading from the pn junction portion will reach the side surface of the trench and will come into contact with the second electrode, and punchthrough will occur if the second conductivity type source breakdown voltage holding layer is formed with a constant width in the lateral direction from the side surface of the trench. Therefore, in this semiconductor device, the source breakdown voltage holding layer is formed so as to become thicker in the lateral direction corresponding to the inclination of the side surface of the source trench. Therefore, it is possible to make the distance between the side surface of the source trench and the pn junction portion wider than in the former example in which the second conductivity type layer having a constant thickness is formed. This makes it difficult for the depletion layer spreading from the pn junction portion to reach the side surface of the source trench. As a result, it is possible to restrain punchthrough and is possible to restrain the occurrence of a leakage current.

Preferably, the semiconductor device further includes a barrier-forming layer that is disposed between the side surface of the source trench and the source electrode and that forms a potential barrier between the barrier-forming layer and the source breakdown voltage holding layer higher than a potential barrier between the source breakdown voltage holding layer and the source electrode.

According to this arrangement, it is possible to restrain punchthrough by means of the barrier-forming layer even if the depletion layer occurred in the pn junction portion between the second conductivity type source breakdown voltage holding layer and the first conductivity type drain layer spreads toward the source trench with respect to the pn junction portion and reaches the side surface of the source trench by means of the application of a reverse bias.

Preferably, the barrier-forming layer is further disposed on an edge portion of the bottom surface of the source trench.

According to this arrangement, it is also possible to restrain punchthrough in the edge portion of the bottom surface of the source trench.

Preferably, the barrier-forming layer is disposed such that the source layer is exposed from the side surface of the source trench.

According to this arrangement, it is possible to increase the contact area of the source layer with respect to the source electrode, and hence is possible to secure excellent electrical conductivity between these components.

The barrier-forming layer may include a metal layer made of any one of, for example, tungsten (W), platinum (Pt), nickel (Ni), cobalt (Co), and molybdenum (Mo).

Additionally, it may include, for example, a first conductivity type polysilicon layer.

Additionally, it may include an insulating layer made of any one of, for example, non-doped polysilicon, silicon oxide ($SiO_2$), aluminum oxide ($Al_2O_3$), and aluminum oxynitride (AlON).

The semiconductor device of the present invention includes a semiconductor layer in which a gate trench having a side surface and a bottom surface and a source trench having a side surface and a bottom surface are formed, a first conductivity type source layer that is disposed so as to be exposed on a surface of the semiconductor layer and that defines the side surface of the gate trench and the side surface of the source trench, a second conductivity type channel layer that is disposed so as to be contiguous to the source layer on a back surface side of the semiconductor layer with respect to the source layer and that defines a part of the side surface of the gate trench and a part of the side surface of the source trench, a first conductivity type drain layer that is disposed so as to be contiguous to the channel layer on the back surface side of the semiconductor layer with respect to the channel layer and that defines the bottom surface of the gate trench and the bottom surface of the source trench, a gate electrode that is embedded in the gate trench and that is made of polysilicon, a gate insulating film disposed between the side and bottom surfaces of the gate trench and the gate electrode, a second conductivity type source breakdown voltage holding layer that is formed so as to be continuous with the channel layer and that is disposed on the side surface and the bottom surface of the source trench, an insulating layer disposed on the side surface of the source trench and an edge portion of the bottom surface of the source trench, a drain electrode electrically connected to the drain layer, and a source electrode that is embedded in the source trench, that has a polysilicon layer at least on the insulating layer, and that is electrically connected to the source layer and to the source breakdown voltage holding layer.

According to this arrangement, when a reverse bias is applied to a pn junction portion between the second conductivity type source breakdown voltage holding layer and the first conductivity type drain layer, a depletion layer occurred in the pn junction portion spreads toward the source trench with respect to the pn junction portion, and is liable to reach the side surface of the source trench. However, in this arrangement, it is possible to restrain punchthrough by means of the insulating layer. The polysilicon layer is disposed on the insulating layer, and therefore it is possible to restrain the depletion layer from further spreading even if the depletion layer crosses even the insulating layer and reaches the source electrode. In other words, it is possible to restrain punchthrough by means of two stages consisting of the insulating layer and the polysilicon layer, and therefore it is possible to excellently restrain the occurrence of a leakage current.

Additionally, the gate electrode is made of polysilicon, and therefore it is possible to form the gate electrode and the polysilicon layer at the same step. Therefore, it is also possible to simplify a manufacturing process.

Preferably, the insulating layer is disposed such that the source layer is exposed from the side surface of the source trench.

According to this arrangement, it is possible to increase the contact area of the source layer with respect to the source electrode, and hence is possible to secure excellent electrical conductivity between these components.

Preferably, the polysilicon layer is embedded in a region inside the insulating layer in the source trench, and the source electrode includes a metal layer stacked on the polysilicon layer embedded in the region.

According to this arrangement, it is only necessary to embed the polysilicon layer in the source trench, and therefore it is possible to easily form the polysilicon layer. Additionally, the source trench is backfilled with the polysilicon layer, and, as a result, it is possible to reduce an apparent difference in height between the bottom surface of the source trench (the upper surface of the polysilicon layer) and the surface of the semiconductor layer. Therefore, it is possible to smooth or flatten the surface of the metal layer.

DESCRIPTION OF EMBODIMENTS

Figure 1:
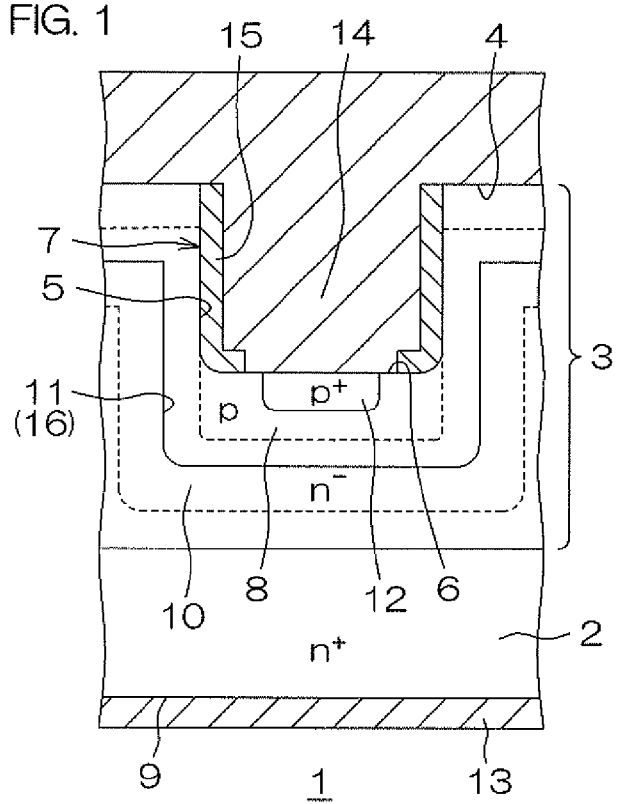
FIG. 1 is a schematic cross-sectional view of a semiconductor device according to a first embodiment of the present invention.

FIG. 1 is a schematic cross-sectional view of a semiconductor device 1 according to a first embodiment of the present invention.

The semiconductor device 1 includes an SiC substrate 2 and an SiC epitaxial layer 3 formed on the SiC substrate 2. In this embodiment, the SiC substrate 2 and the SiC epitaxial layer 3 are shown as one example of a semiconductor layer of the present invention.

The conductivity type of the SiC substrate 2 is, for example, an n$^+$ type having an n type dopant concentration of from $1 \times 10^{18}$ cm$^{-3}$ to $1 \times 10^{21}$ cm$^{-3}$. For example, N (nitrogen), P (phosphorus), As (arsenic), etc., can be used as the n type dopant (the same applies hereinafter).

A trench 7 that has a side surface 5 and a bottom surface 6 is formed at a surface 4 of the SiC epitaxial layer 3. The trench 7 may be made, for example, in the striped form of a plurality of trenches. In the present embodiment, the side surface 5 of the trench 7 is inclined at an angle θ of 90° with respect to the bottom surface 6 of the trench 7. As a result, the trench 7 has a constant width from the bottom surface 6 to its opening end.

The SiC epitaxial layer 3 includes a p type layer 8 that is formed so as to follow the side surface 5 and the bottom surface 6 of the trench 7 and that is one example of a second conductivity type layer of the present invention and an n$^-$ type layer 10 that is formed so as to be contiguous to the p type layer 8 on a back surface side 9 of the SiC substrate 2 and that is one example of a first conductivity type layer of the present invention. The conductivity type of the p type layer 8 is, for example, a p type having a p type dopant concentration of from $1 \times 10^{16}$ cm$^{-3}$ to $1 \times 10^{20}$ cm$^{-3}$. For example, B (boron), Al (aluminum), etc., can be used as the p type dopant. The conductivity type of the n$^-$ type layer 10 is an n$^-$ type having an n type dopant concentration of from $1 \times 10^{15}$ to $1 \times 10^{17}$ cm$^{-3}$. For example, this n$^-$ type layer 10 may function as a drain region (drift region) of a MISFET (Metal Insulator Semiconductor Field Effect Transistor), as a drift region of an IGBT (Insulated Gate Bipolar Transistor), and as an n type region of a pn diode.

More specifically, the p type layer 8 is formed continuously in a winding manner when viewed cross-sectionally such that an interface 11 with the n$^-$ type layer 10 extends (for example, in parallel) along the surface 4 of the SiC epitaxial layer 3, the side surface 5 of the trench 7, and the bottom surface 6 of the trench 7. As a result, the interface 11 between the p type layer 8 and the n$^-$ type layer 10 is set at upper and lower positions with respect to the bottom surface 6 of the trench 7. Therefore, the n$^-$ type layer 10 selectively enters (protrudes toward) the side of the trench 7.

The p type layer 8 has mutually different thicknesses between the bottom surface 6 and the side surface 5 of the trench 7. More specifically, a part on the bottom surface 6 of the p type layer 8 is thicker than a part on the side surface 5 thereof, and, as a result, differences in the thickness of the p type layer 8 are made between the bottom surface 6 and the side surface 5. This layer-thickness difference is produced by a difference in ion incident angle between the side surface 5 of the trench 7 and the bottom surface 6 of the trench 7, for example, when the p type layer 8 is formed by ion implantation. In other words, ions impinge on the bottom surface 6 of the trench 7 substantially perpendicularly, and therefore, in the bottom surface 6, the ions are implanted more deeply than in the side surface 5 of the trench 7 on which ions impinge at an extremely small inclination angle, and the P type layer 8 is formed more thickly.

The p type layer 8 includes a p$^+$ type contact layer 12 having a higher concentration than the other parts of the p type layer 8. The p$^+$ type contact layer 12 is formed, for example, in the center in a width direction of the bottom surface 6 of the trench 7 apart from the side surface 5 of the trench 7. The conductivity type of the p$^+$ type contact layer 12 is, for example, a p$^+$ type having a p type dopant concentration of from $1 \times 10^{18}$ cm$^{-3}$ to $2 \times 10^{21}$ cm$^{-3}$.

A back-surface electrode 13 that is one example of a first electrode of the present invention is formed on the back surface 9 of the SiC substrate 2. The back-surface electrode 13 is electrically connected to the n$^-$ type layer 10 through the SiC substrate 2. The back-surface electrode 13 is made of, for example, Ti, Ni, Cu, Al, Ag, Au, TiN, or W, or has a layered structure made of any combination of these elements.

On the other hand, a surface electrode 14 that is one example of a second electrode of the present invention is formed on the SiC epitaxial layer 3. The surface electrode 14 is formed so as to backfill the trench 7 and to cover the surface 4 of the SiC epitaxial layer 3. The surface electrode 14 is electrically connected to the p type layer 8 in the p$^+$ type contact layer 12. The surface electrode 14 is made of, for example, Ti, Ni, Cu, Al, Ag, Au, TiN, or W, or has a layered structure made of any combination of these elements.

A barrier-forming layer 15 that has a potential barrier higher than a potential barrier between the p type layer 8 and the surface electrode 14 is formed between the side surface 5 and the surface electrode 14 in the trench 7. More specifically, the barrier-forming layer 15 is selectively formed at the side surface 5 and at an edge portion of the bottom surface 6 of the trench 7 so that the p type layer 8 is selectively exposed from the bottom surface 6 of the trench 7.

The p+ type contact layer 12 is exposed at the bottom surface 6 of the trench 7 from which the barrier-forming layer 15 has been selectively removed. The side surface 5 of the trench 7 is covered with the barrier-forming layer 15 in a region ranging from the bottom surface 6 to its opening end.

The barrier-forming layer 15 may be a metal layer made of any one of, for example, tungsten (W), platinum (Pt), nickel (Ni), cobalt (Co), and molybdenum (Mo). Alternatively, the barrier-forming layer 15 may be an n type polysilicon layer or may be an insulating layer made of any one of non-doped polysilicon, silicon oxide ($SiO_2$), aluminum oxide ($Al_2O_3$), and aluminum oxynitride (AlON).

According to this semiconductor device 1, a depletion layer is occurred in a pn junction portion 16 between the p type layer 8 and the n− type layer 10. When a reverse bias is applied to this pn junction portion 16, the depletion layer spreads, for example, like the broken line of FIG. 1. At this time, in a semiconductor device that does not have the barrier-forming layer 15, a depletion layer, which has reached the side surface 5 of the trench 7, reaches the surface electrode 14 directly, and therefore punchthrough occurs. However, according to this semiconductor device 1, it is possible to restrain punchthrough by means of the barrier-forming layer 15 even if a depletion layer spreads and reaches the side surface 5 of the trench 7. As a result, it is possible to restrain the occurrence of a leakage current.

Figure 2:
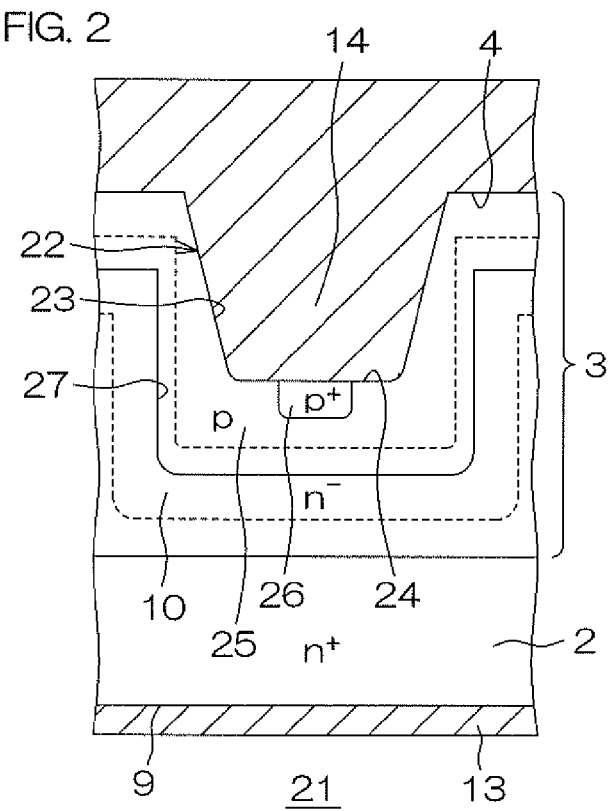
FIG. 2 is a schematic cross-sectional view of a semiconductor device according to a second embodiment of the present invention.

FIG. 2 is a schematic cross-sectional view of a semiconductor device 21 according to a second embodiment of the present invention. In FIG. 2, the same reference sign as in FIG. 1 is given to a component equivalent to each component shown in FIG. 1, and a description of this component is omitted.

A taper trench 22 is formed at a surface 4 of an SiC epitaxial layer 3 of the semiconductor device 21 according to the second embodiment. The taper trench 22 has its side surface 23 inclined with respect to a bottom surface 24 at an obtuse angle (for example, the narrow angle between the side surface 23 and the bottom surface 24 of the taper trench 22 is an angle θ of 20° to 70°).

The SiC epitaxial layer 3 includes a p type layer 25 formed so as to follow the side surface 23 and the bottom surface 24 of the taper trench 22 and an n− type layer 10 formed so as to be contiguous to the p type layer 25 on the back surface side 9) of the SiC substrate 2.

The p type layer 25 is formed continuously in a winding manner when viewed cross-sectionally in the same way as the p type layer 25 of the first embodiment. A part of the p type layer 25 along the side surface of the taper trench is formed so as to become thicker in a lateral direction corresponding to the inclination of the side surface 23 of the taper trench 22, and hence has differences in the layer thickness. More specifically, this part of the p type layer 25 becomes continuously thicker as the opening width of the taper trench 22 becomes continuously narrower in a depth direction.

The p type layer 25 includes a p+ type contact layer 26 having a higher concentration than the other parts of the p type layer 25. The p+ type contact layer 26 is formed, for example, in the center in the width direction of the bottom surface 24 of the taper trench 22 apart from the side surface 23 of the taper trench 22.

In the taper trench 22, the surface electrode 14 is in direct contact with the side surface 23 of the taper trench 22 without a barrier-forming layer, which differs from the first embodiment.

According to this semiconductor device 21, a depletion layer is occurred in a pn junction portion 27 between the p type layer 25 and the n− type layer 10. When a reverse bias is applied to this pn junction portion 27, the depletion layer spreads, for example, like the broken line of FIG. 2. At this time, there is a fear that the depletion layer spreading from the pn junction portion 27 will reach the side surface 23 of the taper trench 22 and will come into contact with the surface electrode 14, and punchthrough will occur if the p type layer 25 is formed with a constant width so as to extend along the side surface 23 and the bottom surface 24 of the taper trench 22.

In this semiconductor device 21, the p type layer 25 is formed so as to become thicker in a lateral direction corresponding to the inclination of the side surface 23 of the taper trench 22, and therefore it is possible to make the distance between the side surface 23 of the taper trench 22 and the pn junction portion 27 wider than in the former example in which the p type layer having a constant thickness is formed. This makes it difficult for the depletion layer spreading from the pn junction portion 27 to reach the side surface 23 of the taper trench 22. As a result, it is possible to restrain punchthrough and is possible to restrain the occurrence of a leakage current.

Figure 3:
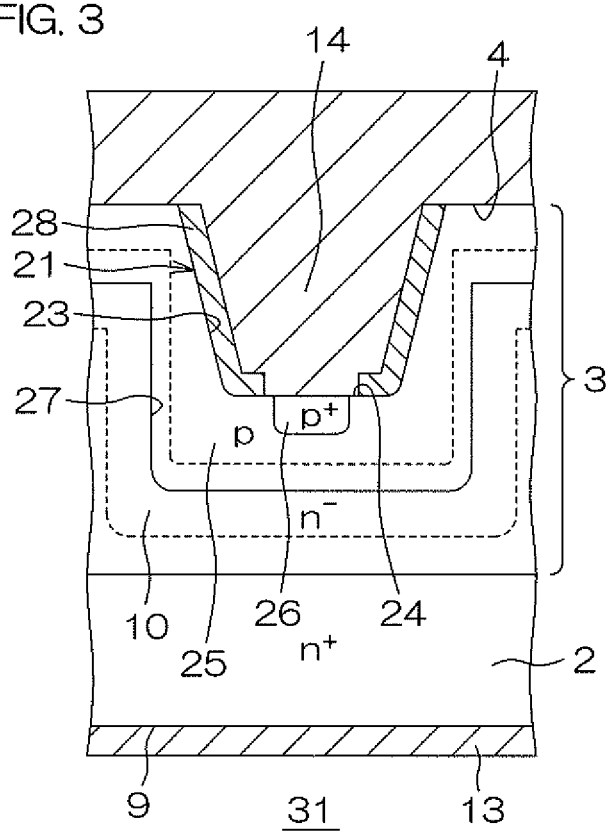
FIG. 3 is a schematic cross-sectional view of a semiconductor device according to a third embodiment of the present invention.

FIG. 3 is a schematic cross-sectional view of a semiconductor device 31 according to a third embodiment of the present invention. In FIG. 3, the same reference sign as in FIG. 1 or FIG. 2 is given to a component equivalent to each component shown in FIG. 1 or FIG. 2, and a description of this component is omitted.

A semiconductor device 31 according to the third embodiment additionally includes a barrier-forming layer 28 that is disposed between the side surface 23 of the taper trench 22 and the surface electrode 14 and that has a higher potential barrier than a potential barrier between the p type layer 25 and the surface electrode 14, in addition to the arrangement of the second embodiment.

More specifically, the barrier-forming layer 28 is selectively formed at the side surface 23 and at an edge portion of the bottom surface 24 of the taper trench 22 such that the p type layer 25 is selectively exposed from the bottom surface 24 of the taper trench 22.

The p+ type contact layer 26 is exposed at the bottom surface 24 of the taper trench 22 from which the barrier-forming layer 28 has been selectively removed. The side surface 23 of the taper trench 22 is covered with the barrier-forming layer 28 in a region ranging from the bottom surface 24 to its opening end.

The barrier-forming layer 28 may be a metal layer made of any one of, for example, tungsten (W), platinum (Pt), nickel (Ni), cobalt (Co), and molybdenum (Mo). Alternatively, the barrier-forming layer 28 may be an n type polysilicon layer or may be an insulating layer made of any one of non-doped polysilicon, silicon oxide ($SiO_2$), aluminum oxide ($Al_2O_3$), and aluminum oxynitride (AlON).

According to this semiconductor device 31, a depletion layer is occurred in a pn junction portion 27 between the p type layer 25 and the n− type layer 10. When a reverse bias is applied to this pn junction portion 27, the depletion layer spreads, for example, like the broken line of FIG. 3. At this time, in a semiconductor device that does not have the barrier-forming layer 28, there is a fear that punchthrough will occur because, if the depletion layer reaches the side surface 23 of the taper trench 22, the depletion layer will reach the surface electrode 14 directly. However, according to this semiconductor device 31, it is possible to restrain punchthrough by means of the barrier-forming layer 28 even if a depletion layer spreads and reaches the side surface 23 of the taper trench 22. As a result, it is possible to restrain the occurrence of a leakage current.

Figure 4:
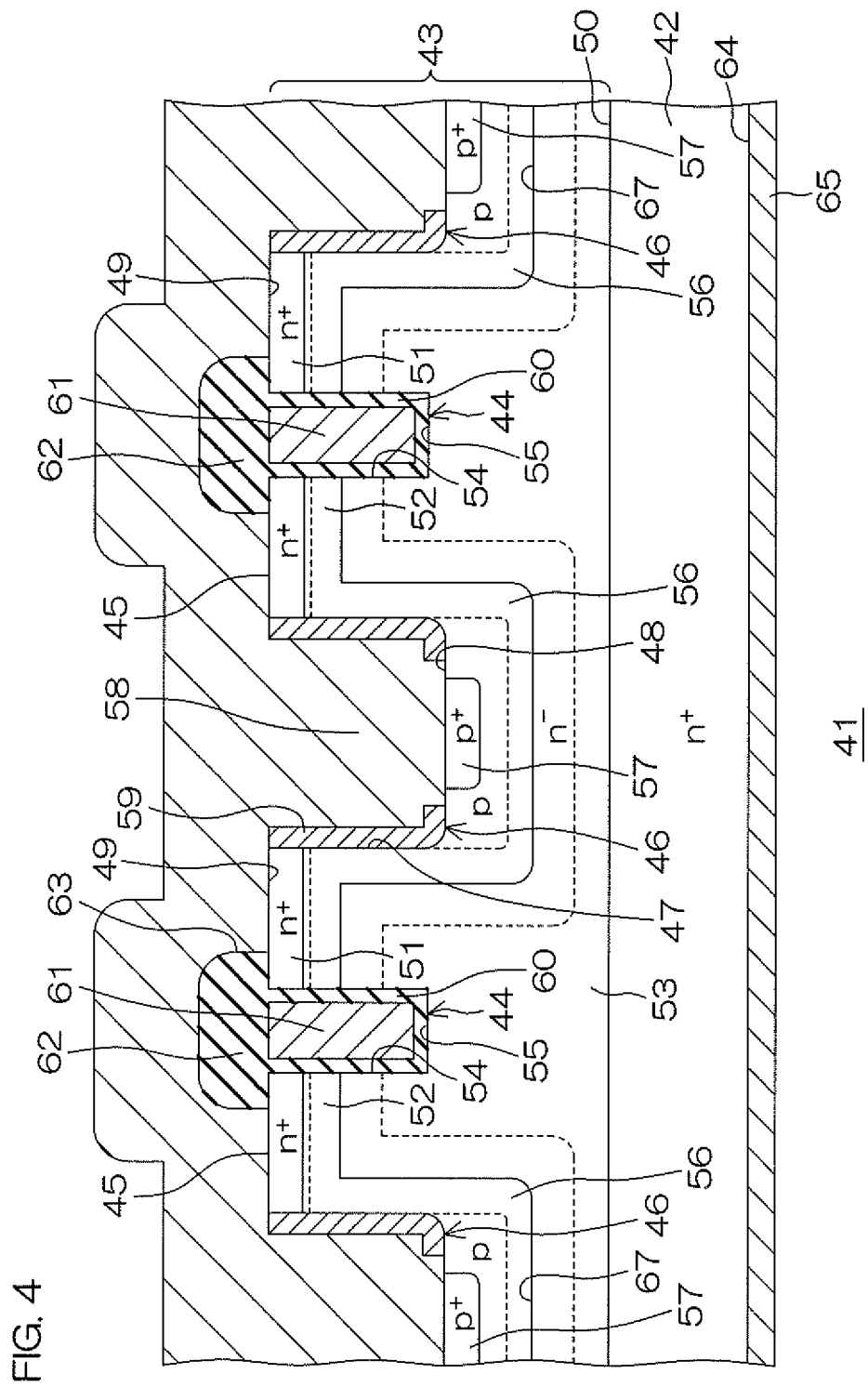
FIG. 4 is a schematic cross-sectional view of a semiconductor device according to a fourth embodiment of the present invention.

FIG. 4 is a schematic cross-sectional view of a semiconductor device 41 according to a fourth embodiment of the present invention.

The semiconductor device 41 according to the fourth embodiment includes a trench-gate type MISFET in which an SiC substrate 42 and an SiC epitaxial layer 43 formed on the SiC substrate 42 are employed. In the present embodiment, the SiC substrate 42 and the SiC epitaxial layer 43 are shown as one example of the semiconductor layer of the present invention.

A gate trench 44 is formed at the SiC epitaxial layer 43. The gate trench 44 may be, for example, a grid-shaped one, a stripe-shaped one, or a honeycomb-shaped one. As a result of the formation of the gate trench 44, a plurality of unit cells 45 are formed at a part surrounded by the gate trench 44 of the SiC epitaxial layer 43.

A source trench 46 is formed at the middle of each unit cell 45. In the present embodiment, a side surface 47 of the source trench 46 is inclined at an angle θ of 90° with respect to a bottom surface 48 of the source trench 46. As a result, the source trench 46 has a constant width from the bottom surface 48 to its opening end. The source trench 46 has the same depth as the gate trench 44.

A source layer 51, a channel layer 52, and a drift layer 53 are formed in each unit cell 45 in order from the surface side 49 of the SiC epitaxial layer 43 toward the back surface 50, and these layers are contiguous to each other. With regard to the conductivity types of these layers, each of the source and drift layers 51 and 53 is an n type that is a first conductivity type, whereas the channel layer 52 is a p type that is a second conductivity type. More specifically, the source layer 51 is, for example, an n$^+$ type having a dopant concentration of from $1 \times 10^{18}$ to $1 \times 10^{21}$ cm$^{-3}$, and the channel layer 52 is, for example, a p type having a dopant concentration of from $1.0 \times 10^{16}$ cm$^{-3}$ to $1.0 \times 10^{19}$ cm$^{-3}$, and the drift layer 53 is, for example, an n$^-$ type having a dopant concentration of from $1 \times 10^{15}$ to $1 \times 10^{17}$ cm$^{-3}$, which is lower in concentration than the source layer 51.

The source layer 51 defines a part of the side surface 54 of the gate trench 44 and a part of the side surface 47 of the source trench 46. Likewise, the channel layer 52 defines a part of the side surface 54 of the gate trench 44 and a part of the side surface 47 of the source trench 46. The drift layer 53 defines the side surface 54 and the bottom surface 55 of the gate trench 44, and defines the side surface 47 and the bottom surface 48 of the source trench 46.

A source breakdown voltage holding layer 56 is formed so as to be continuous with the channel layer 52 from the bottom surface 48 of the source trench 46 along the side surface 47 of the source trench 46.

The source breakdown voltage holding layer 56 has mutually different thicknesses between the bottom surface 48 and the side surface 47 of the source trench 46. More specifically, a part on the bottom surface 48 of the source breakdown voltage holding layer 56 is thicker than a part on the side surface 47 thereof, and, as a result, differences in the thickness of the source breakdown voltage holding layer 56 are made between the bottom surface 48 and the side surface 47.

This layer-thickness difference is produced by a difference in ion incident angle between the side surface 47 of the source trench 46 and the bottom surface 48 of the source trench 46, for example, when the source breakdown voltage holding layer 56 is formed by ion implantation. In other words, ions impinge on the bottom surface 48 of the source trench 46 substantially perpendicularly, and therefore, in the bottom surface 48, the ions are implanted more deeply than in the side surface 47 of the source trench 46 on which ions impinge at an extremely small inclination angle, and the source breakdown voltage holding layer 56 is formed more thickly.

The source breakdown voltage holding layer 56 includes a p$^+$ type contact layer 57 having a higher concentration, e.g., having a dopant concentration of from $1.0 \times 10^{18}$ cm$^{-3}$ to $2.0 \times 10^{21}$ cm$^{-3}$ than the other parts of the source breakdown voltage holding layer 56. The contact layer 57 is formed, for example, in the center in the width direction of the bottom surface 48 of the source trench 46 apart from the side surface 47 of the source trench 46.

A barrier-forming layer 59 that has a potential barrier higher than a potential barrier between the source breakdown voltage holding layer 56 and the source electrode 58 is formed between the side surface 47 and a source electrode 58 (described later) in the source trench 46. More specifically, the barrier-forming layer 59 is selectively formed at the side surface 47 and at an edge portion of the bottom surface 48 of the source trench 46 such that the source breakdown voltage holding layer 56 is selectively exposed from the bottom surface 48 of the source trench 46.

The p$^+$ type contact layer 57 is exposed at the bottom surface 48 of the source trench 46 from which the barrier-forming layer 59 has been selectively removed. The side surface 47 of the source trench 46 is covered with the barrier-forming layer 59 in a region ranging from the bottom surface 48 to its opening end.

The barrier-forming layer 59 may be a metal layer made of any one of, for example, tungsten (W), platinum (Pt), nickel (Ni), cobalt (Co), and molybdenum (Mo). Alternatively, the barrier-forming layer 59 may be an n type polysilicon layer or may be an insulating layer made of any one of non-doped polysilicon, silicon oxide ($SiO_2$), aluminum oxide ($Al_2O_3$), and aluminum oxynitride (AlON).

A gate electrode 61 is embedded in the gate trench 44 with a gate insulating film 60 therebetween. The gate electrode 61 is made of, for example, polysilicon.

An interlayer film 62 made of an insulating material is formed on the surface 49 of the SiC epitaxial layer 43 so as to coat the gate electrode 61 therewith.

A contact hole 63 is formed in the interlayer film 62 and in the gate insulating film 60. As a result, the whole of the source trench 46 of each unit cell 45 and a peripheral edge portion of the source trench 46 in the SiC epitaxial layer 43 are exposed in the contact hole 63, and a level difference is made in accordance with a difference in height between the surface 49 of the SiC epitaxial layer 43 and the bottom surface 48 of the source trench 46.

A source electrode 58, which is made of a metallic material, such as Ti, Ni, Cu, Al, Ag, Au, TiN, or W, or has a layered structure or the like made of any combination of these elements, is formed on the surface 49 of the SiC epitaxial layer 43. The source electrode 58 enters the source trenches 46 of all unit cells 45 through each contact hole 63 in the lump. This source electrode 58 is a shared wiring with respect to all unit cells 45.

A drain electrode 65, which is made of a metallic material, such as Ti, Ni, Cu, Al, Ag, Au, TiN, or W, or has a layered structure or the like made of any combination of these elements, is formed on a back surface 64 of the SiC substrate 42 so as to cover its entire region. This drain electrode 65 is a shared electrode with respect to all unit cells 45.

According to this semiconductor device 41, a depletion layer is occurred in a pn junction portion 67 between the source breakdown voltage holding layer 56 and the drift layer 53. When a reverse bias is applied to this pn junction portion 67, the depletion layer spreads, for example, like the broken line of FIG. 4. At this time, in a semiconductor device that does not have the barrier-forming layer 59, a depletion layer, which has reached the side surface 47 and the edge of the bottom surface 48 of the source trench 46, reaches the surface electrode 58 directly, and therefore punchthrough occurs. However, according to this semiconductor device 41, it is possible to restrain punchthrough by means of the barrier-forming layer 59 even if a depletion layer spreads and reaches the side surface 47 and the edge portion of the bottom surface 48 of the source trench 46. As a result, it is possible to restrain the occurrence of a leakage current.

Figure 5:
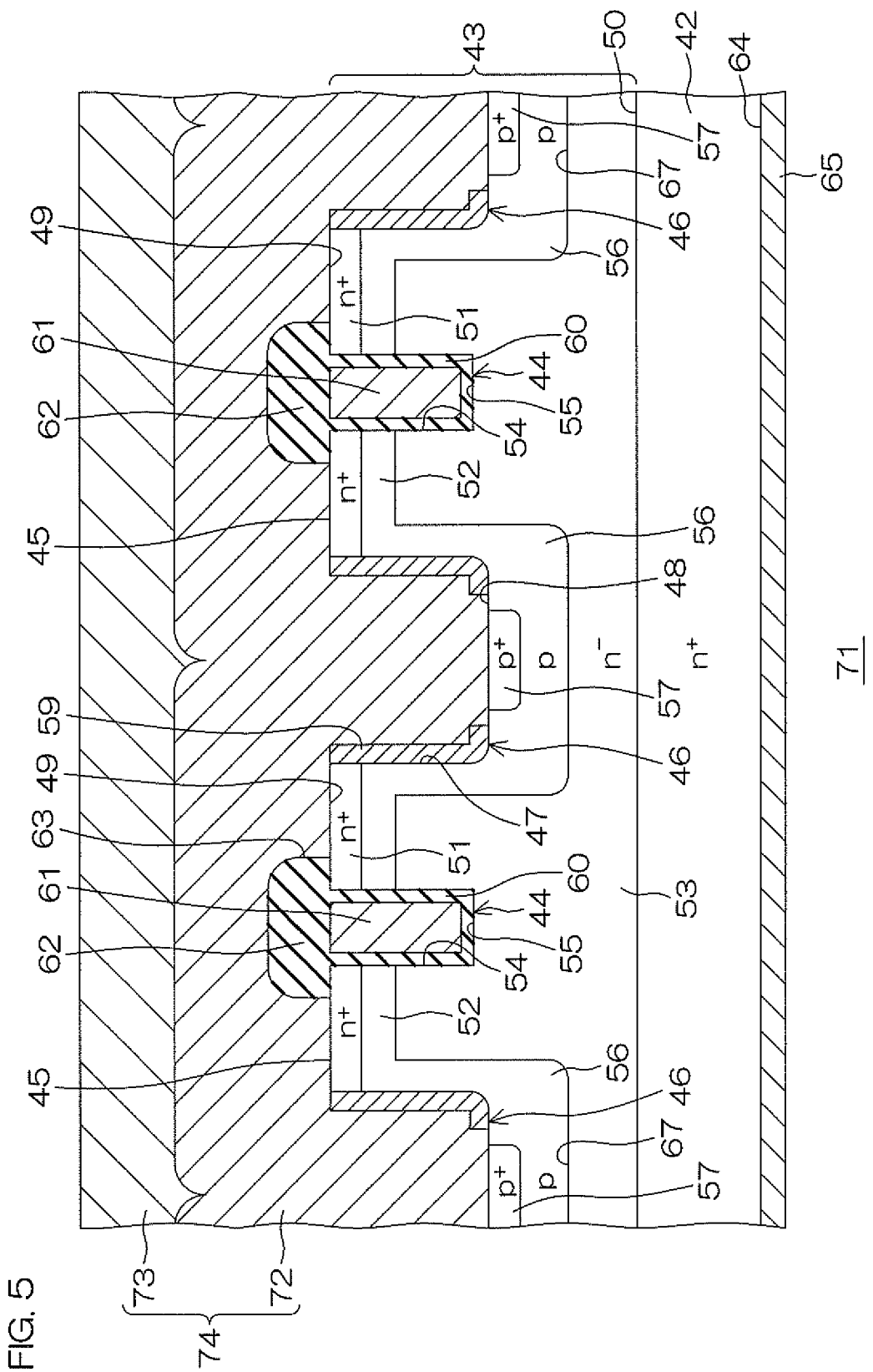
FIG. 5 is a schematic cross-sectional view of a semiconductor device according to a fifth embodiment of the present invention.

FIG. 5 is a schematic cross-sectional view of a semiconductor device 71 according to a fifth embodiment of the present invention. In FIG. 5, the same reference sign as in FIG. 4 is given to a component equivalent to each component shown in FIG. 4, and a description of this component is omitted.

The semiconductor device 71 according to the fifth embodiment includes a source electrode 74 that has a polysilicon layer 72 and a metal layer 73 stacked on the polysilicon layer 72, instead of the source electrode 58 of the fourth embodiment.

The polysilicon layer 72 is embedded in the source trench 46, and is formed flatly so as to cover the surface 49 of the SiC epitaxial layer 43 and the interlayer film 62 therewith.

According to this semiconductor device 71, the polysilicon layer 72 is formed on the surface 49 of the SiC epitaxial layer 43 so as to backfill the source trench 46 and the contact hole 63, and therefore it is possible to reduce an apparent difference in height of the surface 49 of the SiC epitaxial layer 43. Therefore, it is possible to smooth or flatten the surface of the source electrode 74.

Figure 6:
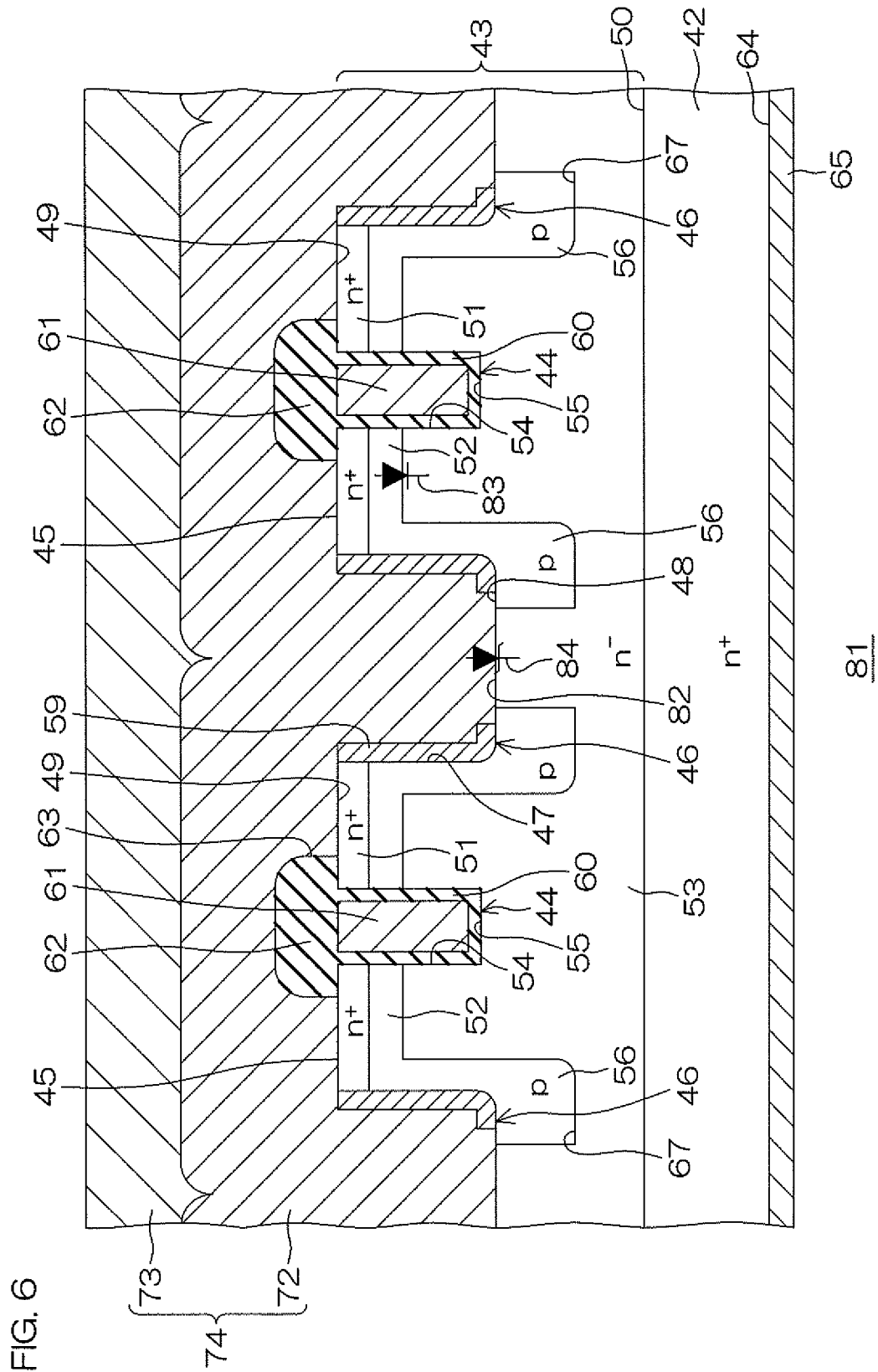
FIG. 6 is a schematic cross-sectional view of a semiconductor device according to a sixth embodiment of the present invention.

FIG. 6 is a schematic cross-sectional view of a semiconductor device 81 according to a sixth embodiment of the present invention. In FIG. 6, the same reference sign as in FIG. 5 is given to a component equivalent to each component shown in FIG. 5, and a description of this component is omitted.

The semiconductor device 81 according to the sixth embodiment includes a structure in which a region below the bottom surface 48 in the source breakdown voltage holding layer 56 including the contact layer 57 is selectively removed from the fifth embodiment.

More specifically, the source breakdown voltage holding layer 56 selectively disposed on the bottom surface 48 of the source trench 46 is annularly formed so as to cover the periphery of the edge portion of the bottom surface 48 of the source trench 46. As a result, the drift layer 53 enters the middle of the bottom surface 48 of the source trench 46 surrounded by the source breakdown voltage holding layer 56, and a heterojunction portion 82 is defined by the polysilicon layer 72 forming the source electrode 74 and by the drift layer 53.

A heterojunction diode 84 having a junction barrier (e.g., the height of the junction barrier is 1 eV to 1.5 eV) smaller than the diffusion potential (e.g., 2.8 eV to 3.2 eV) of a body diode 83 formed by pn junction between the channel layer 52 and the drift layer 53 is formed at the heterojunction portion 82.

In the semiconductor device 81, an electric current preferentially flows to the heterojunction diode 84 when a reverse bias is applied to the pn junction portion 67 between the channel layer 52 and the drift layer 53, and therefore it is possible to restrain the expansion of a crystal defect of SiC in the SiC epitaxial layer 43. As a result, it is possible to restrain a rise in on-resistance, and it is possible to reduce losses in the semiconductor device 81.

Figure 7:
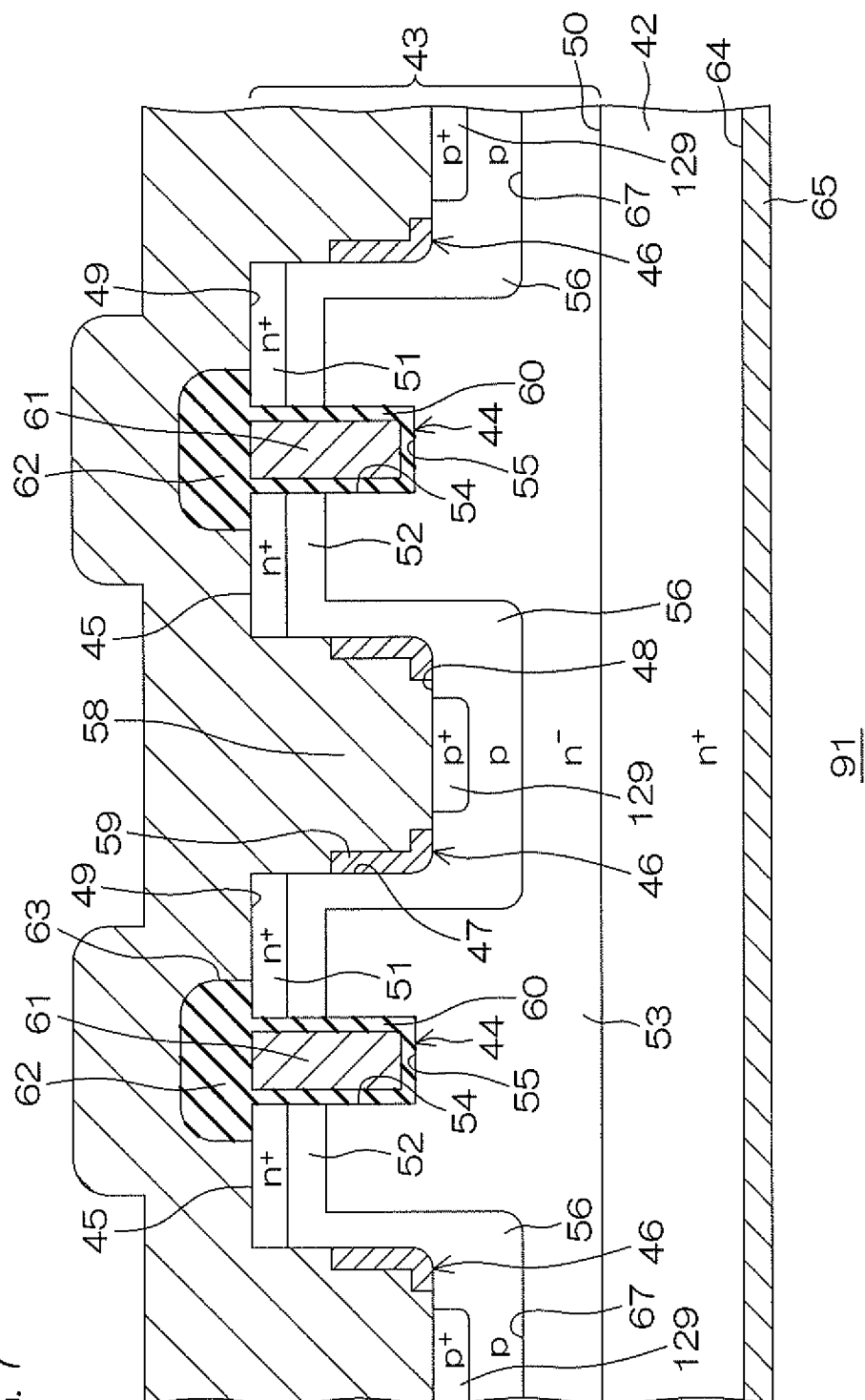
FIG. 7 is a schematic cross-sectional view of a semiconductor device according to a seventh embodiment of the present invention.

FIG. 7 is a schematic cross-sectional view of a semiconductor device 91 according to a seventh embodiment of the present invention. In FIG. 7, the same reference sign as in FIG. 4 is given to a component equivalent to each component shown in FIG. 4, and a description of this component is omitted.

The semiconductor device 91 according to the seventh embodiment includes a structure in which the barrier-forming layer 59 is disposed such that the source layer 51 is exposed from the side surface 47 of the source trench 46 in the arrangement of FIG. 4.

More specifically, the barrier-forming layer 59 is disposed so as to selectively cover a part below the channel layer 52 of the side surface 47 of the source trench 46. As a result, the source layer 51 and the channel layer 52 are exposed to the side surface 47 of the source trench 46.

This arrangement makes it possible to increase the contact area of the source layer 51 with respect to the source electrode 74, and hence makes it possible to secure excellent electrical conductivity between these components.

Figure 8:
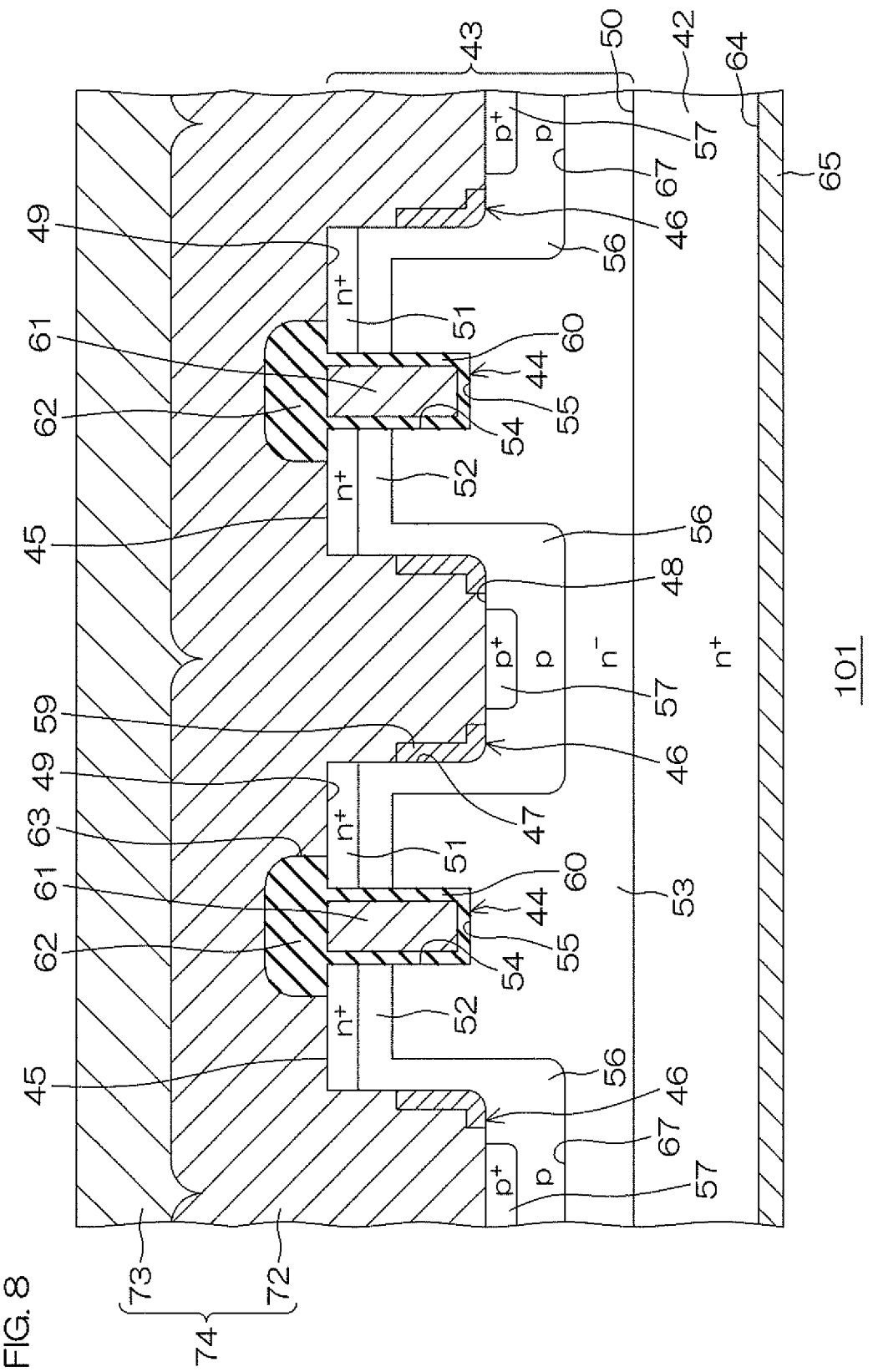
FIG. 8 is a schematic cross-sectional view of a semiconductor device according to an eighth embodiment of the present invention.

FIG. 8 is a schematic cross-sectional view of a semiconductor device 101 according to an eighth embodiment of the present invention. In FIG. 8, the same reference sign as in FIG. 5 is given to a component equivalent to each component shown in FIG. 5, and a description of this component is omitted.

The semiconductor device 101 according to the eighth embodiment includes a structure in which the barrier-forming layer 59 is disposed such that the source layer 51 is exposed from the side surface 47 of the source trench 46 in the arrangement of FIG. 5.

More specifically, the barrier-forming layer 59 is disposed so as to selectively cover a part below the channel layer 52 of the side surface 47 of the source trench 46. As a result, the source layer 51 and the channel layer 52 are exposed to the side surface 47 of the source trench 46.

This arrangement makes it possible to increase the contact area of the source layer 51 with respect to the source electrode 74, and hence makes it possible to secure excellent electrical conductivity between these components.

Figure 9:
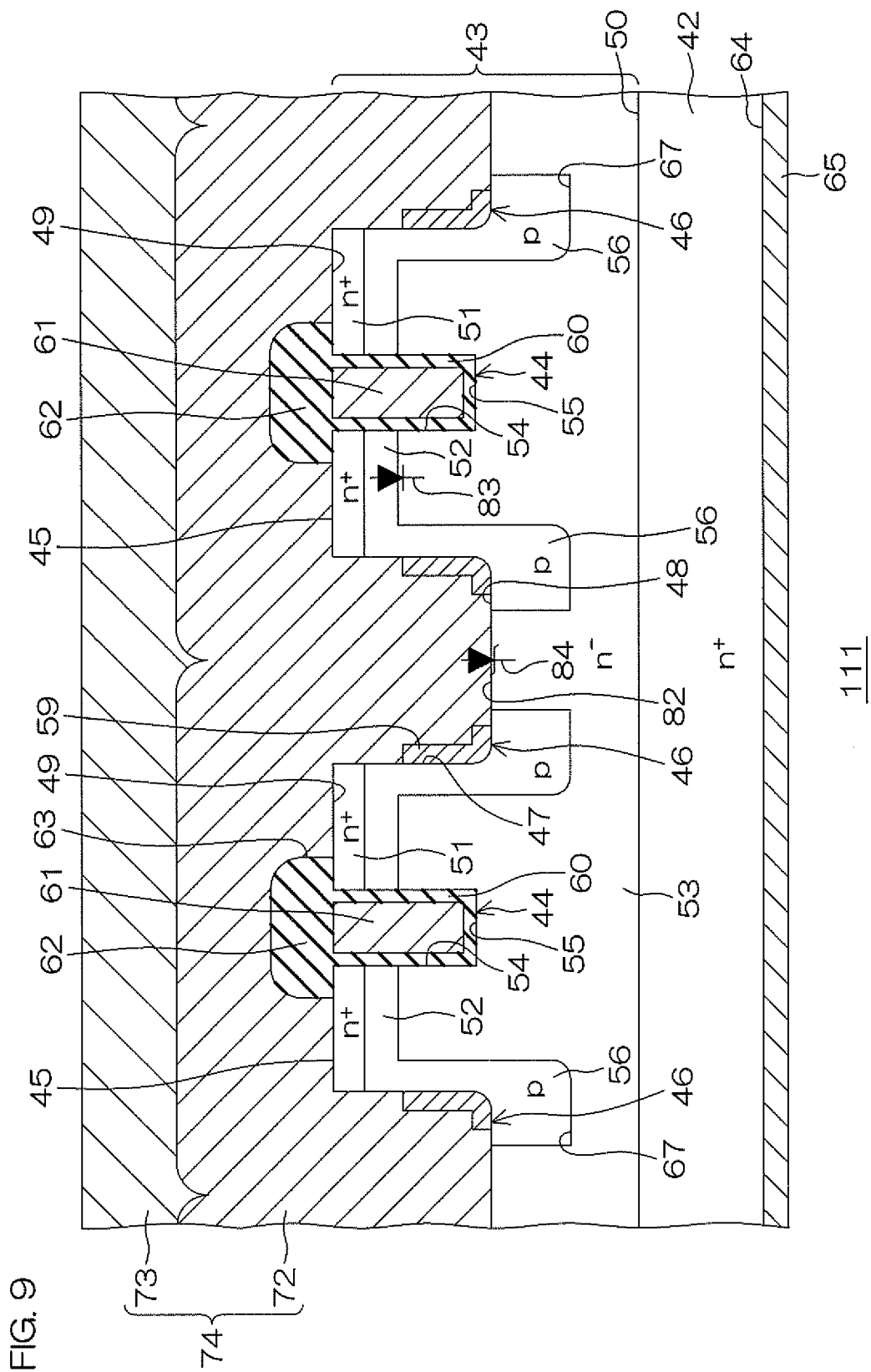
FIG. 9 is a schematic cross-sectional view of a semiconductor device according to a ninth embodiment of the present invention.

FIG. 9 is a schematic cross-sectional view of a semiconductor device 111 according to a ninth embodiment of the present invention. In FIG. 9, the same reference sign as in FIG. 6 is given to a component equivalent to each component shown in FIG. 6, and a description of this component is omitted.

The semiconductor device 111 according to the ninth embodiment includes a structure in which the barrier-forming layer 59 is disposed such that the source layer 51 is exposed from the side surface 47 of the source trench 46 in the arrangement of FIG. 6.

More specifically, the barrier-forming layer 59 is disposed so as to selectively cover a part below the channel layer 52 of the side surface 47 of the source trench 46. As a result, the source layer 51 and the channel layer 52 are exposed to the side surface 47 of the source trench 46.

This arrangement makes it possible to increase the contact area of the source layer 51 with respect to the source electrode 74, and hence makes it possible to secure excellent electrical conductivity between these components.

Figure 10:
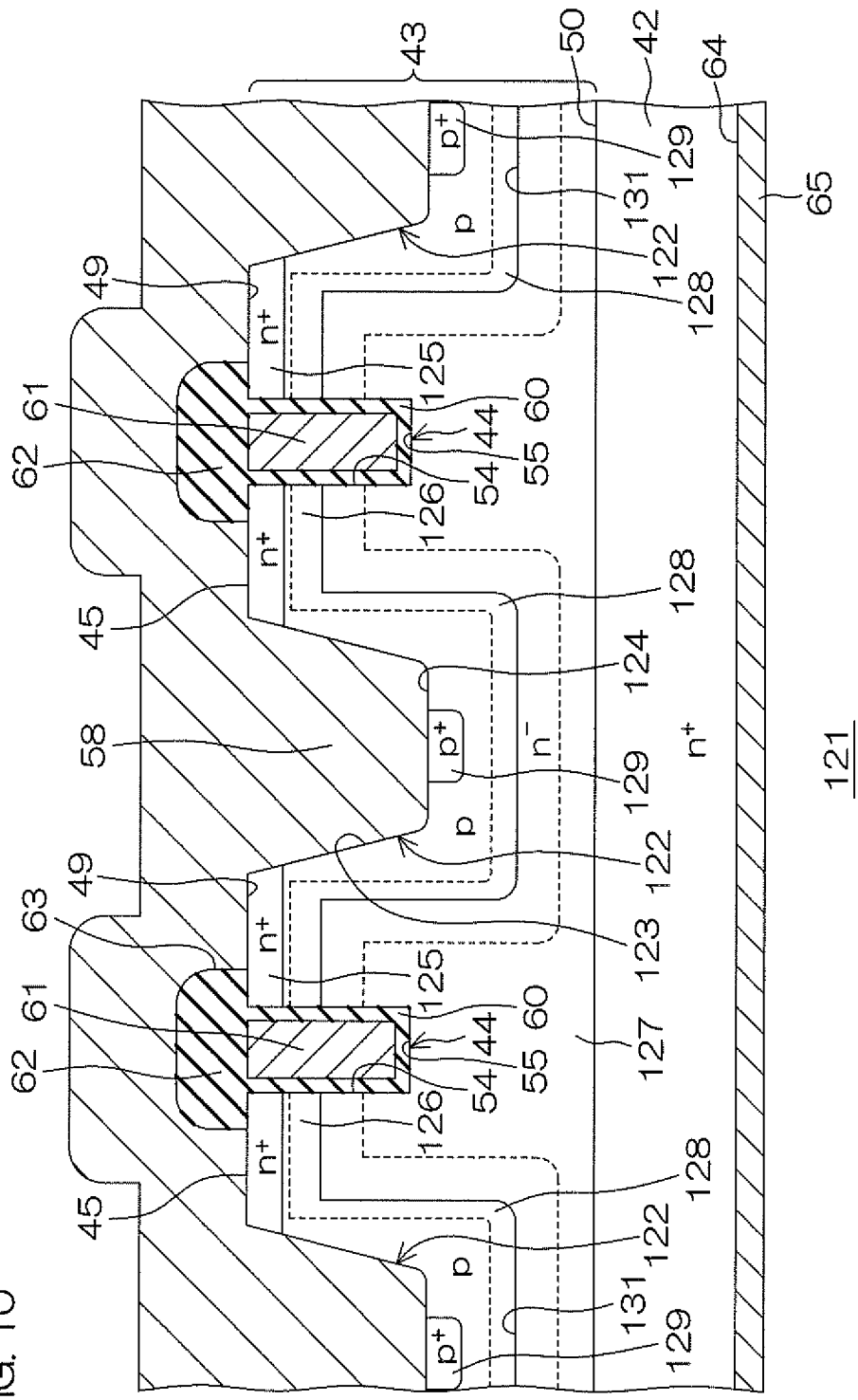
FIG. 10 is a schematic cross-sectional view of a semiconductor device according to a tenth embodiment of the present invention.

FIG. 10 is a schematic cross-sectional view of a semiconductor device 121 according to a tenth embodiment of the present invention. In FIG. 10, the same reference sign as in FIG. 4 is given to a component equivalent to each component shown in FIG. 4, and a description of this component is omitted.

The semiconductor device 121 according to the tenth embodiment includes a trench-gate type MISFET in which an SiC substrate 42 and an SiC epitaxial layer 43 formed on the SiC substrate 42 are employed. In the present embodiment, the SiC substrate 42 and the SiC epitaxial layer 43 are shown as one example of the semiconductor layer of the present invention.

A gate trench 44 is formed at the SiC epitaxial layer 43. The gate trench 44 may be, for example, a grid-shaped one, a stripe-shaped one, or a honeycomb-shaped one. As a result of the formation of the gate trench 44, a plurality of unit cells 45 are formed at a part surrounded by the gate trench 44 of the SiC epitaxial layer 43.

A taper trench 122 is formed at the middle of each unit cell 45. In the present embodiment, the taper trench 122 has its side surface 123 inclined with respect to its bottom surface 124 at an obtuse angle (for example, the narrow angle between the side surface 123 and the bottom surface 124 of the taper trench 122 is an angle θ of 20° to 70°).

A source layer 125, a channel layer 126, and a drift layer 127 are formed in each unit cell 45 in order from the surface side 49 of the SiC epitaxial layer 43 toward the back surface 50, and these layers are contiguous to each other. With regard to the conductivity types of these layers, each of the source and drift layers 125 and 127 is an n type that is a first conductivity type, whereas the channel layer 126 is a p type that is a second conductivity type.

The source layer 125 defines a part of the side surface 54 of the gate trench 44 and a part of the side surface 123 of the taper trench 122. Likewise, the channel layer 126 defines a part of the side surface 54 of the gate trench 44 and a part of the side surface 123 of the taper trench 122. The drift layer 127 defines the side surface 54 and the bottom surface 55 of the gate trench 44, and defines the side surface 123 and the bottom surface 124 of the taper trench 122.

A source breakdown voltage holding layer 128 is formed so as to be continuous with the channel layer 126 from the bottom surface 124 of the taper trench 122 along the side surface 123 of the taper trench 122.

Apart of the source breakdown voltage holding layer 128 along the side surface 123 of the taper trench is formed so as to become thicker in a lateral direction corresponding to the inclination of the side surface 123 of the taper trench 122, and hence has differences in the layer thickness. More specifically, this part of the source breakdown voltage holding layer 128 becomes continuously thicker as the opening width of the taper trench 122 becomes continuously narrower in a depth direction.

The source breakdown voltage holding layer 128 includes a p+ type contact layer 129 having a higher concentration than the other parts of the source breakdown voltage holding layer 128. The contact layer 129 is formed, for example, in the center in the width direction of the bottom surface 124 of the taper trench 122 apart from the side surface 123 of the taper trench 122.

A gate electrode 61 is embedded in the gate trench 44 with a gate insulating film 60 therebetween. The gate electrode 61 is made of, for example, polysilicon.

An interlayer film 62 is stacked on the surface 49 of the SiC epitaxial layer 43 so as to coat the gate electrode 61 therewith.

A contact hole 63 is formed in the interlayer film 62 and in the gate insulating film 60. As a result, the whole of the taper trench 122 of each unit cell 45 and a peripheral edge portion of the taper trench 122 in the SiC epitaxial layer 43 are exposed in the contact hole 63, and a level difference is made in accordance with a difference in height between the surface 49 of the SiC epitaxial layer 43 and the bottom surface 124 of the taper trench 122.

A source electrode 58, which is made of a metallic material, such as Ti, Ni, Cu, Al, Ag, Au, TiN, or W, or has a layered structure or the like made of any combination of these elements, is formed on the surface 49 of the SiC epitaxial layer 43. The source electrode 58 enters the taper trenches 122 of all unit cells 45 through each contact hole 63 in the lump. This source electrode 58 is a shared wiring with respect to all unit cells 45. In the present embodiment, the source electrode 58 is in direct contact with the side surface 123 of the taper trench 122 without a barrier-forming layer, which differs from the fourth embodiment.

A drain electrode 65, which is made of a metallic material, such as Ti, Ni, Cu, Al, Ag, Au, TiN, or W, or has a layered structure or the like made of any combination of these elements, is formed on a back surface 64 of the SiC substrate 42 so as to cover its entire region. This drain electrode 65 is a shared electrode with respect to all unit cells 45.

According to this semiconductor device 121, a depletion layer is occurred in a pn junction portion 131 between the source breakdown voltage holding layer 128 and the drift layer 127. When a reverse bias is applied to this pn junction portion 131, the depletion layer spreads, for example, like the broken line of FIG. 10. At this time, there is a fear that the depletion layer spreading from the pn junction portion 131 will reach the side surface 123 of the taper trench 122 and will come into contact with the source electrode 58, and punch-through will occur if the source breakdown voltage holding layer 128 is formed with a constant width so as to extend along the side surface 123 and the bottom surface 124 of the taper trench 122.

However, in this semiconductor device 121, the source breakdown voltage holding layer 128 is formed so as to become thicker in a lateral direction corresponding to the inclination of the side surface 123 of the taper trench 122, and therefore it is possible to make the distance between the side surface 123 of the taper trench 122 and the pn junction portion 131 wider than in the former example in which the source breakdown voltage holding layer 128 having a constant thickness is formed. This makes it difficult for the depletion layer spreading from the pn junction portion 131 to reach the side surface 123 of the taper trench 122. As a result, it is possible to restrain punchthrough and is possible to restrain the occurrence of a leakage current.

Figure 11:
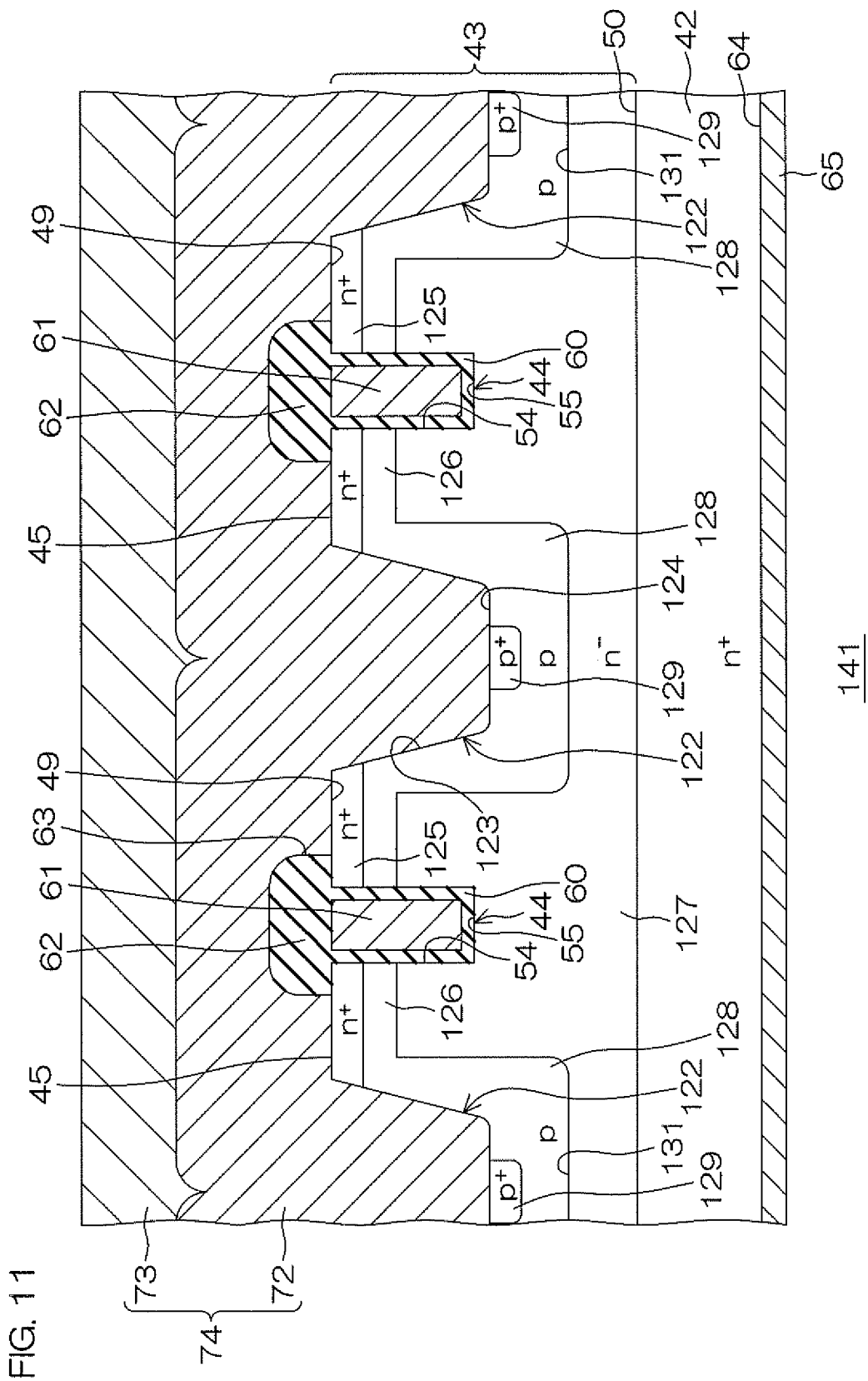
FIG. 11 is a schematic cross-sectional view of a semiconductor device according to an eleventh embodiment of the present invention.

FIG. 11 is a schematic cross-sectional view of a semiconductor device 141 according to an eleventh embodiment of the present invention. In FIG. 11, the same reference sign as in FIG. 10 is given to a component equivalent to each component shown in FIG. 10, and a description of this component is omitted.

The semiconductor device 141 according to the eleventh embodiment includes a source electrode 74 that has a polysilicon layer 72 and a metal layer 73 stacked on the polysilicon layer 72, instead of the source electrode 58 of the tenth embodiment.

The polysilicon layer 72 is embedded in the taper trench 122, and is formed flatly so as to cover the SiC epitaxial layer 43 and the interlayer film 62 therewith.

According to this semiconductor device 141, the polysilicon layer 72 is formed on the surface 49 of the SiC epitaxial layer 43 so as to backfill the taper trench 122 and the contact hole 63, and therefore it is possible to reduce an apparent difference in height of the surface 49 of the SiC epitaxial layer 43. Therefore, it is possible to smooth or flatten the surface of the source electrode 74.

Figure 12:
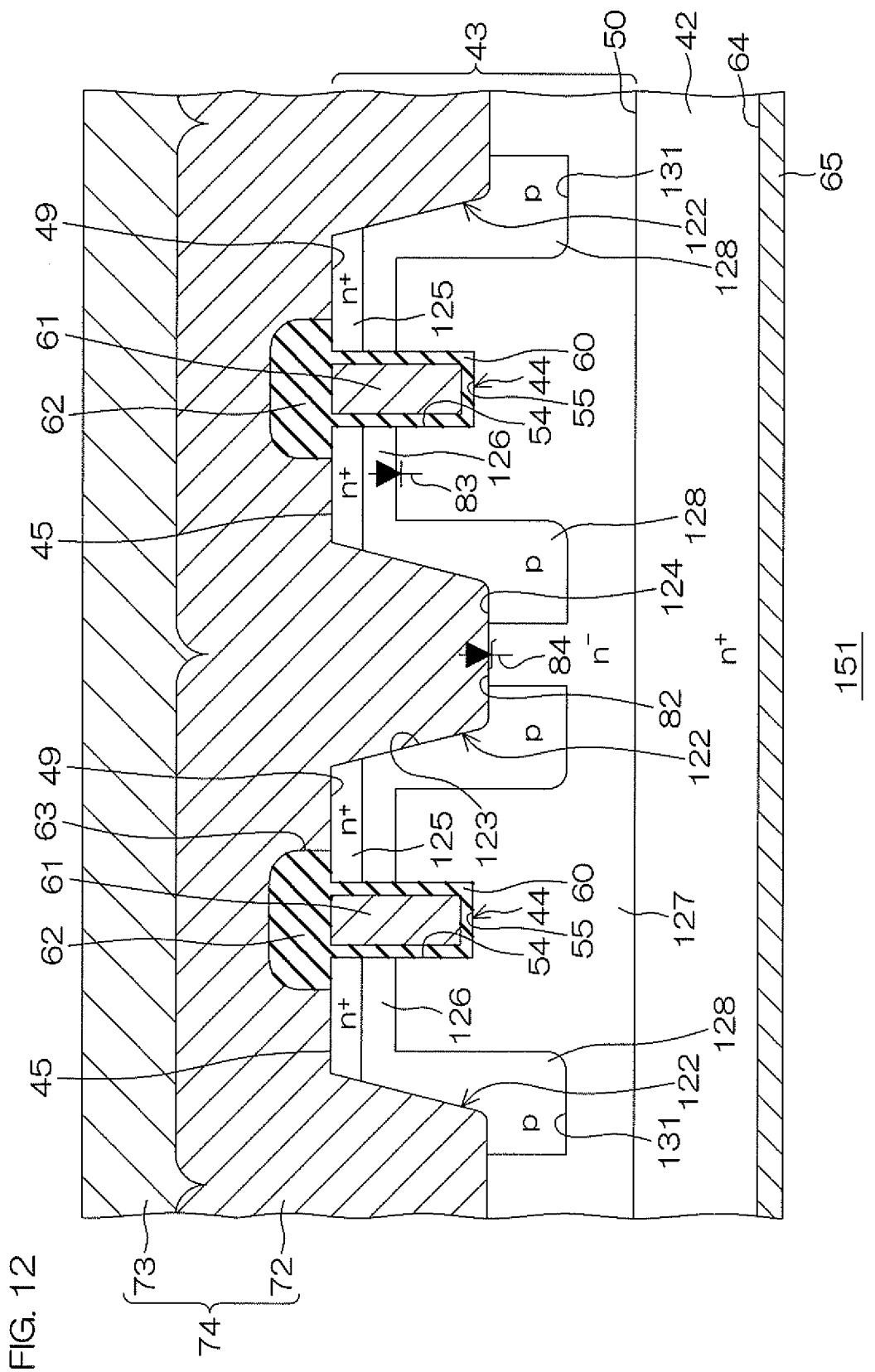
FIG. 12 is a schematic cross-sectional view of a semiconductor device according to a twelfth embodiment of the present invention.

FIG. 12 is a schematic cross-sectional view of a semiconductor device 151 according to a twelfth embodiment of the present invention. In FIG. 12, the same reference sign as in FIG. 11 is given to a component equivalent to each component shown in FIG. 11, and a description of this component is omitted.

The semiconductor device 151 according to the twelfth embodiment includes a structure in which a region below the bottom surface 124 in the source breakdown voltage holding layer 128 including the contact layer 129 is selectively removed from the eleventh embodiment.

More specifically, the source breakdown voltage holding layer 128 selectively disposed on the bottom surface 124 of the taper trench 122 is annularly formed so as to cover the periphery of the edge of the bottom surface 124 of the taper trench 122. As a result, the drain layer 130 enters the middle of the bottom surface 124 of the taper trench 122 surrounded by the source breakdown voltage holding layer 128, and a heterojunction portion 82 is defined by the polysilicon layer 72 forming the source electrode 74 and by the drain layer 130.

A heterojunction diode 84 having a junction barrier (e.g., the height of the junction barrier is 1 eV to 1.5 eV) smaller than the diffusion potential (e.g., 2.8 eV to 3.2 eV) of a body diode 83 formed by pn junction between the channel layer 126 and the drain layer 130 is formed at the heterojunction portion 82.

In the semiconductor device 151, an electric current preferentially flows to the heterojunction diode 84 when a reverse bias is applied to the pn junction portion 131 between the channel layer 126 and the drain layer 130, and therefore it is possible to restrain the expansion of a crystal defect of SiC in the SiC epitaxial layer 43. As a result, it is possible to restrain a rise in on-resistance, and it is possible to reduce losses in the semiconductor device 151.

Figure 13:
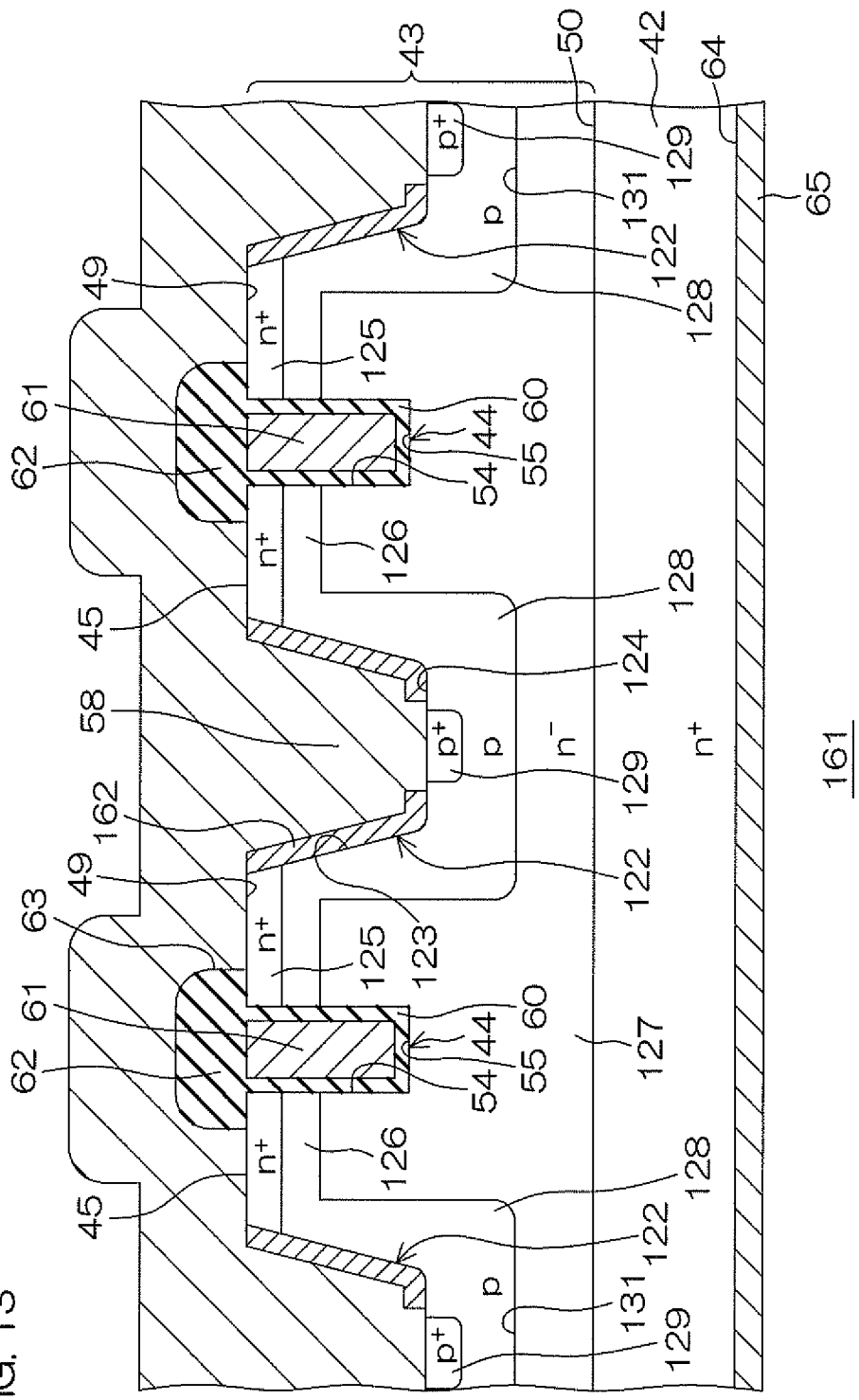
FIG. 13 is a schematic cross-sectional view of a semiconductor device according to a thirteenth embodiment of the present invention.

FIG. 13 is a schematic cross-sectional view of a semiconductor device 161 according to a thirteenth embodiment of the present invention. In FIG. 13, the same reference sign as in FIG. 10 is given to a component equivalent to each component shown in FIG. 10, and a description of this component is omitted.

The semiconductor device 161 according to the thirteenth embodiment additionally includes a barrier-forming layer 162 that is disposed between the side surface 123 of the taper trench 122 and the source electrode 74 and that has a higher potential barrier than a potential barrier between the source breakdown voltage holding layer 128 and the source electrode 74, in addition to the arrangement of the tenth embodiment.

More specifically, the barrier-forming layer 162 is selectively formed at the side surface 123 and at an edge portion of the bottom surface 124 of the taper trench 122 so that the source breakdown voltage holding layer 128 is selectively exposed from the bottom surface 124 of the taper trench 122.

The barrier-forming layer 162 may be a metal layer made of any one of, for example, tungsten (W), platinum (Pt), nickel (Ni), cobalt (Co), and molybdenum (Mo). Alternatively, the barrier-forming layer 162 may be an n type polysilicon layer or may be an insulating layer made of any one of non-doped polysilicon, silicon oxide ($SiO_2$), aluminum oxide ($Al_2O_3$), and aluminum oxynitride (AlON).

According to this semiconductor device 161, a depletion layer is occurred in a pn junction portion 131 between the source breakdown voltage holding layer 128 and the drain layer 130. When a reverse bias is applied to this pn junction portion 131, the depletion layer spreads in the pn junction portion 131. At this time, in a semiconductor device that does not have the barrier-forming layer 162, there is a fear that punchthrough will occur because, if the depletion layer reaches the side surface 123 of the taper trench 122, the depletion layer will reach the source electrode 58 directly.

However, according to this semiconductor device 151, it is possible to restrain punchthrough by means of the barrier-forming layer 162 even if a depletion layer spreads and reaches the side surface 123 of the taper trench 122. As a result, it is possible to restrain the occurrence of a leakage current.

Figure 14:
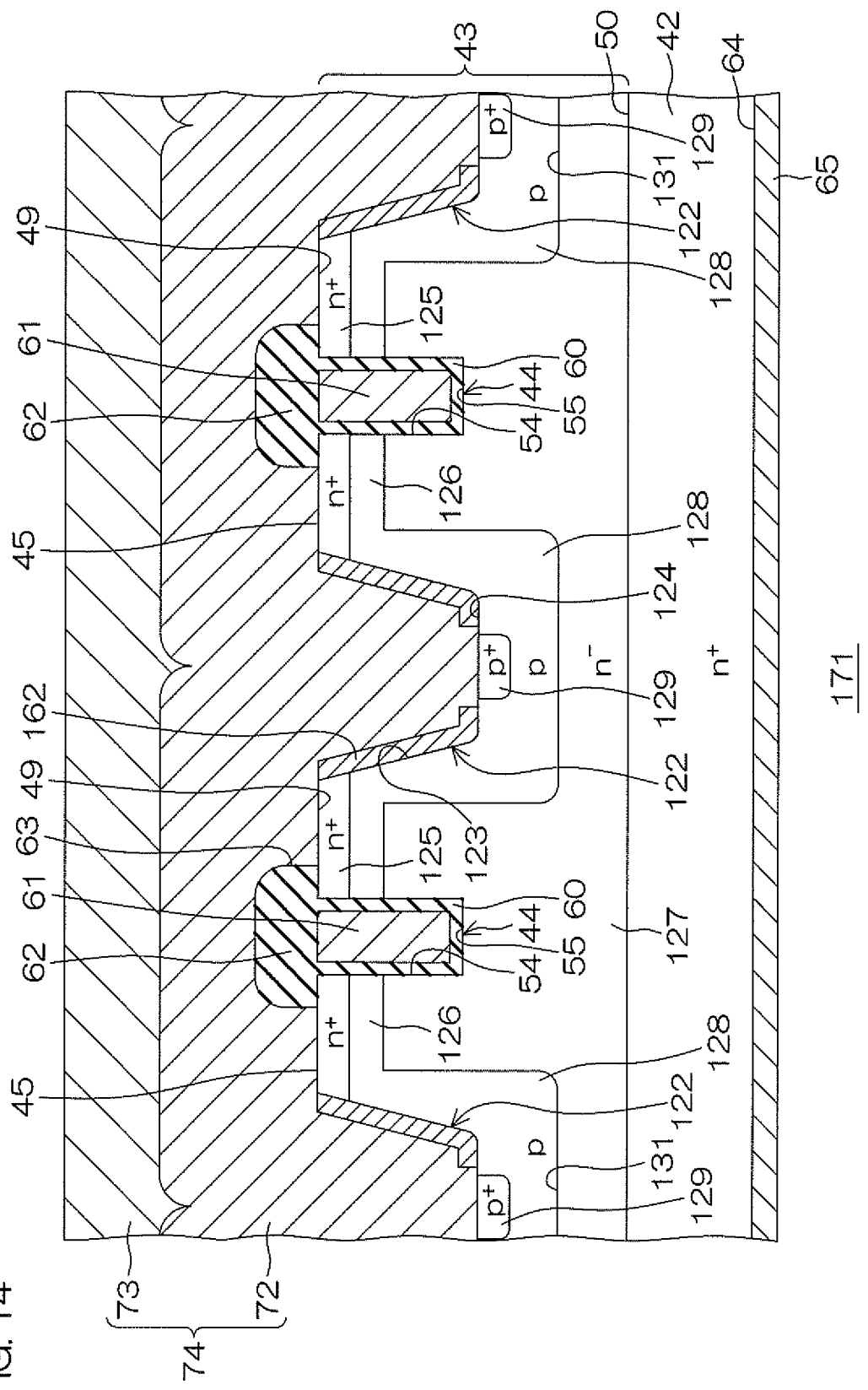
FIG. 14 is a schematic cross-sectional view of a semiconductor device according to a fourteenth embodiment of the present invention.

FIG. 14 is a schematic cross-sectional view of a semiconductor device 171 according to a fourteenth embodiment of the present invention. In FIG. 14, the same reference sign as in FIG. 11 is given to a component equivalent to each component shown in FIG. 11, and a description of this component is omitted.

The semiconductor device 171 according to the fourteenth embodiment additionally includes the barrier-forming layer 162 that is disposed between the side surface 123 of the taper trench 122 and the source electrode 74 and that has a higher potential barrier than a potential barrier between the source breakdown voltage holding layer 128 and the source electrode 58, in addition to the arrangement of the eleventh embodiment.

More specifically, the barrier-forming layer 162 is selectively formed at the side surface 123 and at the edge portion of the bottom surface 124 of the taper trench 122 such that the source breakdown voltage holding layer 128 is selectively exposed from the bottom surface 124 of the taper trench 122.

The barrier-forming layer 162 may be a metal layer made of any one of, for example, tungsten (W), platinum (Pt), nickel (Ni), cobalt (Co), and molybdenum (Mo). Alternatively, the barrier-forming layer 162 may be an n type polysilicon layer or may be an insulating layer made of any one of non-doped polysilicon, silicon oxide ($SiO_2$), aluminum oxide ($Al_2O_3$), and aluminum oxynitride (AlON).

According to this semiconductor device 161, a depletion layer is occurred in the pn junction portion 131 between the source breakdown voltage holding layer 128 and the drain layer. When a reverse bias is applied to this pn junction portion 131, the depletion layer spreads in the pn junction portion 131. At this time, in a semiconductor device that does not have the barrier-forming layer 162, there is a fear that punchthrough will occur because, if the depletion layer reaches the side surface 123 of the taper trench 122, the depletion layer will reach the source electrode 74 directly.

However, according to this semiconductor device 171, it is possible to restrain punchthrough by means of the barrier-forming layer 162 even if a depletion layer spreads and reaches the side surface 123 of the taper trench 122. As a result, it is possible to restrain the occurrence of a leakage current.

Figure 15:
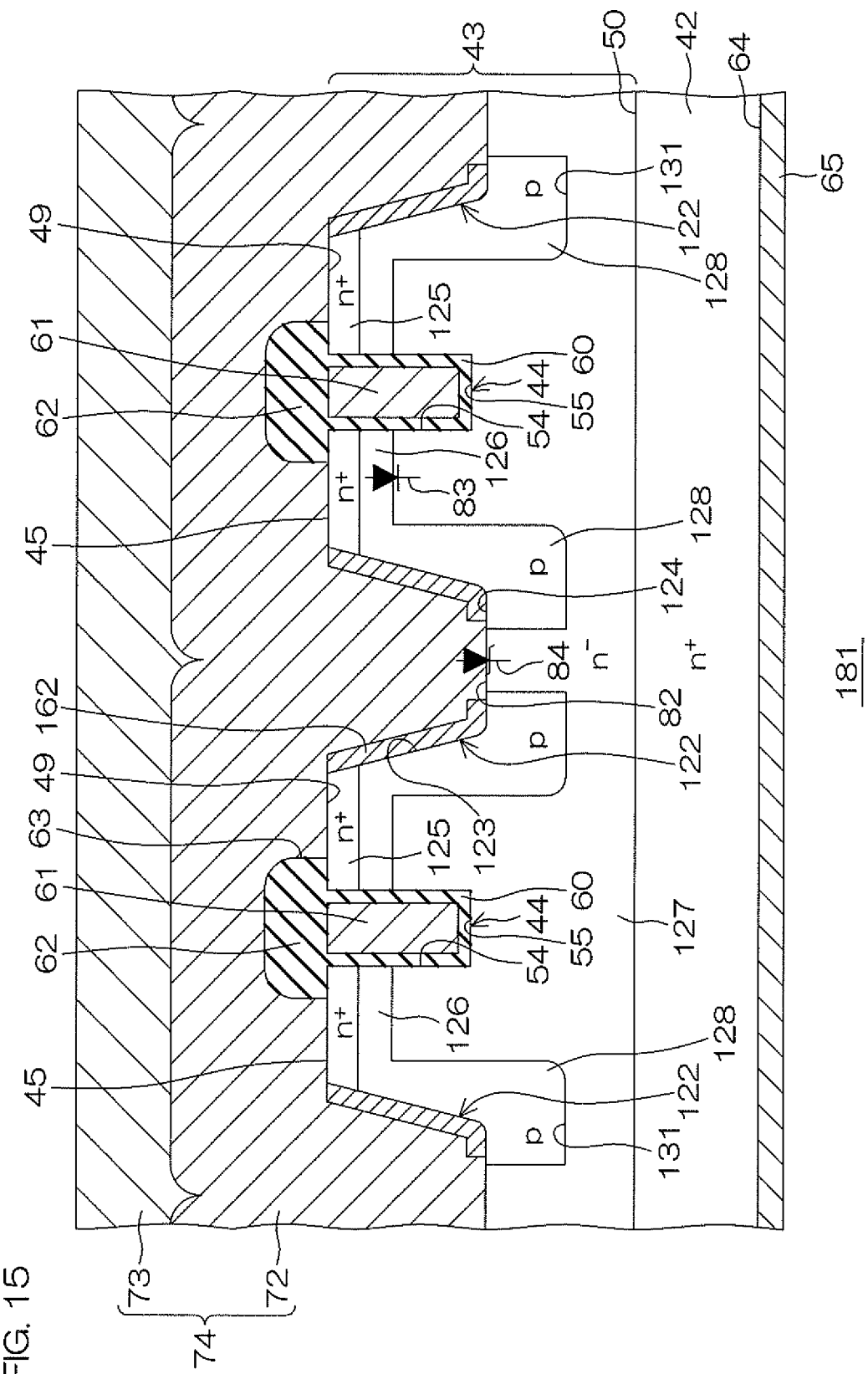
FIG. 15 is a schematic cross-sectional view of a semiconductor device according to a fifteenth embodiment of the present invention.

FIG. 15 is a schematic cross-sectional view of a semiconductor device 181 according to a fifteenth embodiment of the present invention. In FIG. 15, the same reference sign as in FIG. 12 is given to a component equivalent to each component shown in FIG. 12, and a description of this component is omitted.

The semiconductor device 181 according to the fifteenth embodiment additionally includes the barrier-forming layer 162 that is disposed between the side surface 123 of the taper trench 122 and the source electrode 74 and that has a higher potential barrier than a potential barrier between the source breakdown voltage holding layer 128 and the source electrode 74, in addition to the arrangement of the twelfth embodiment.

More specifically, the barrier-forming layer 162 is selectively formed at the side surface 123 and at the edge portion of the bottom surface 124 of the taper trench 122 such that the source breakdown voltage holding layer 128 is selectively exposed from the bottom surface of the taper trench 122.

The barrier-forming layer 162 may be a metal layer made of any one of, for example, tungsten (W), platinum (Pt), nickel (Ni), cobalt (Co), and molybdenum (Mo). Alternatively, the barrier-forming layer 162 may be an n type polysilicon layer or may be an insulating layer made of any one of non-doped polysilicon, silicon oxide ($SiO_2$), aluminum oxide ($Al_2O_3$), and aluminum oxynitride (AlON).

According to this semiconductor device 181, a depletion layer is occurred in the pn junction portion 131 between the source breakdown voltage holding layer 128 and the drain layer 130. When a reverse bias is applied to this pn junction portion 131, the depletion layer spreads in the pn junction portion 131. At this time, in a semiconductor device that does not have the barrier-forming layer 162, there is a fear that punchthrough will occur because, if the depletion layer reaches the side surface 123 of the taper trench 122, the depletion layer will reach the source electrode 74 directly.

However, according to this semiconductor device 181, it is possible to restrain punchthrough by means of the barrier-forming layer 162 even if a depletion layer spreads and reaches the side surface 123 of the taper trench 122. As a result, it is possible to restrain the occurrence of a leakage current.

Figure 16:
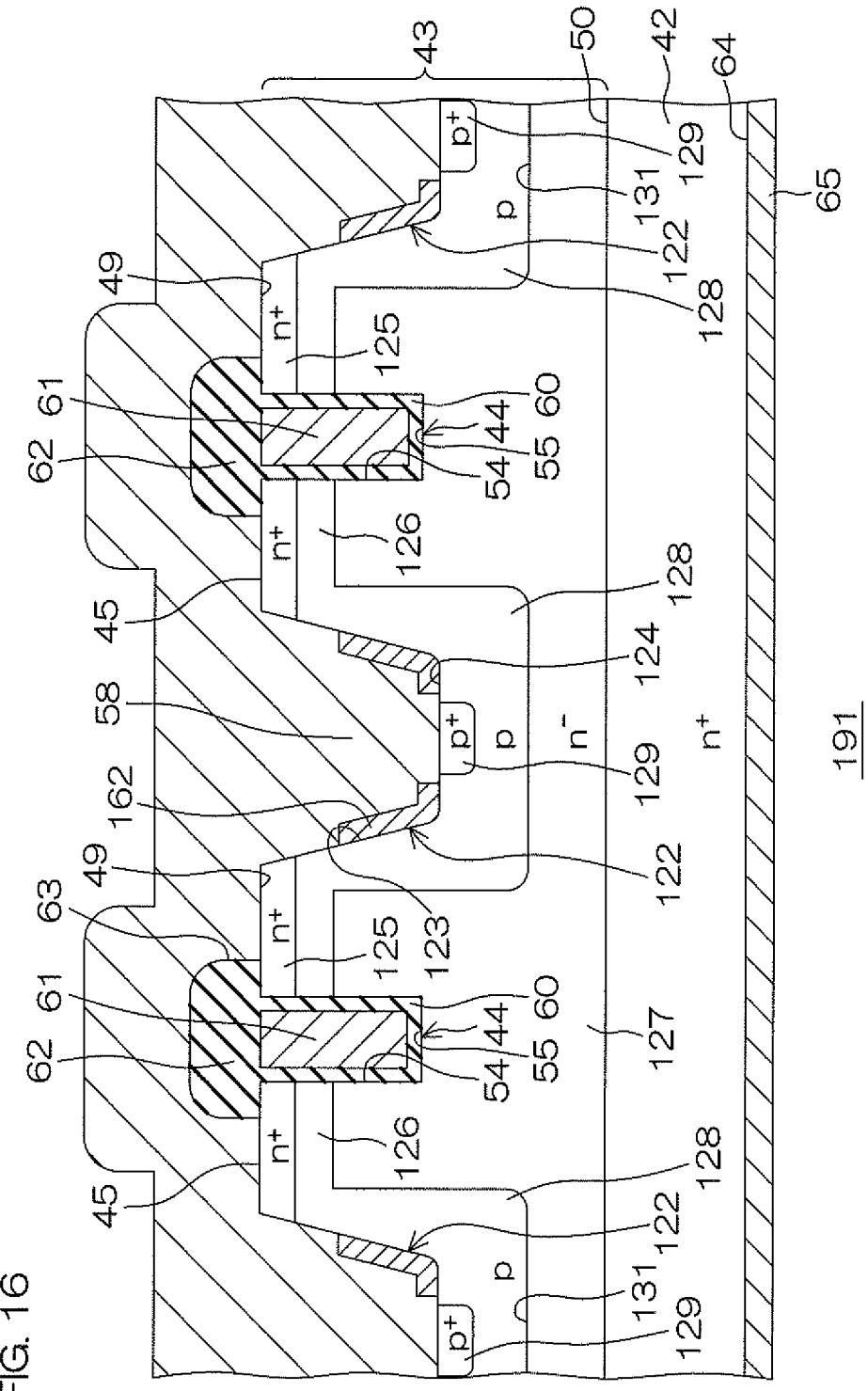
FIG. 16 is a schematic cross-sectional view of a semiconductor device according to a sixteenth embodiment of the present invention.

FIG. 16 is a schematic cross-sectional view of a semiconductor device 191 according to a sixteenth embodiment of the present invention. In FIG. 16, the same reference sign as in FIG. 13 is given to a component equivalent to each component shown in FIG. 13, and a description of this component is omitted.

The semiconductor device 191 according to the sixteenth embodiment includes a structure in which the barrier-forming layer 162 is disposed such that the source layer 125 is exposed from the side surface 123 of the taper trench 122 in the arrangement of FIG. 13.

More specifically, the barrier-forming layer 162 is disposed so as to selectively cover a part below the channel layer 126 of the side surface 123 of the taper trench 122. As a result, the source layer 125 and the channel layer 126 are exposed to the side surface 123 of the taper trench 122.

This arrangement makes it possible to increase the contact area of the source layer 125 with respect to the source electrode 58, and hence makes it possible to secure excellent electrical conductivity between these components.

Figure 17:
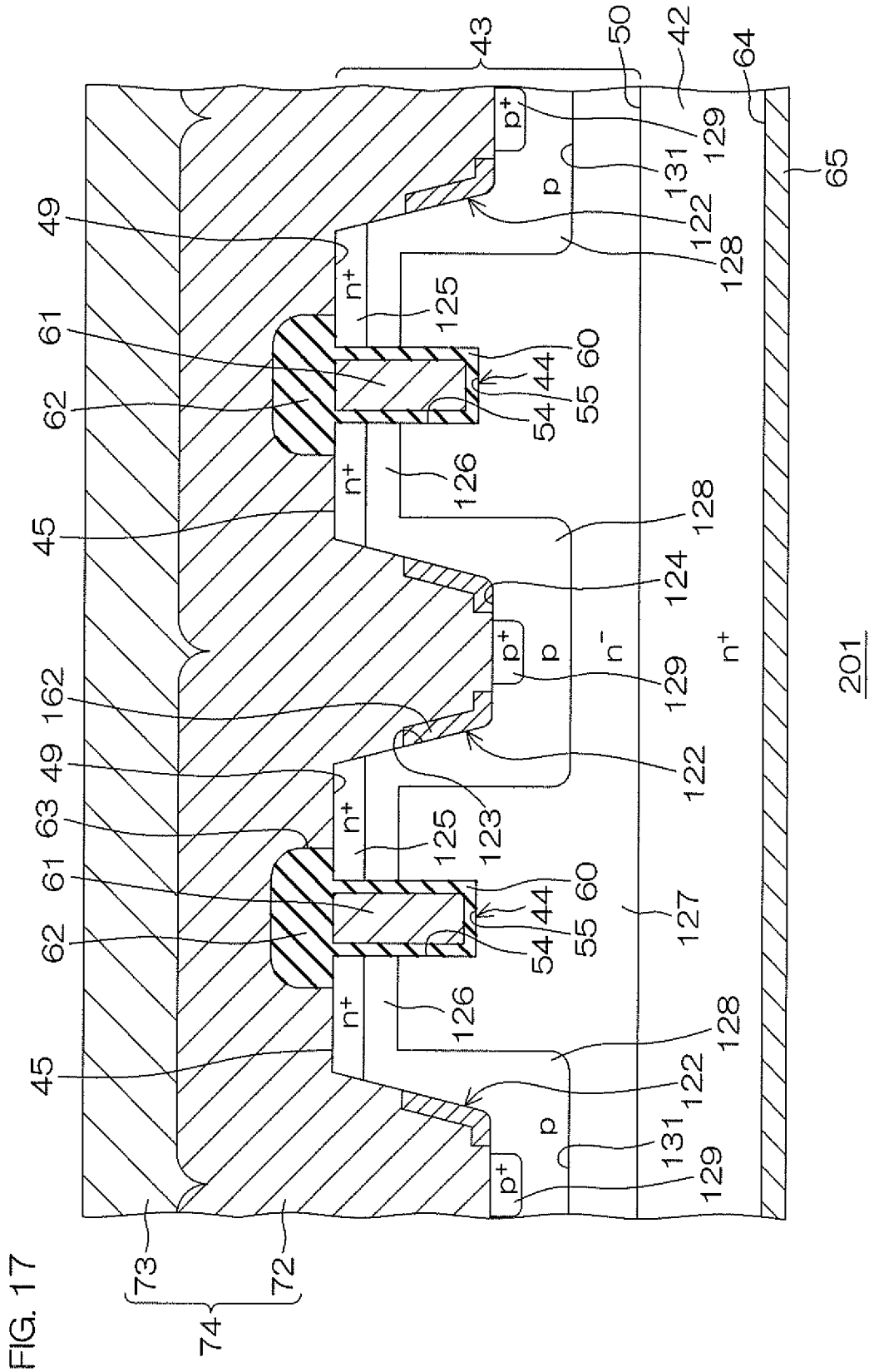
FIG. 17 is a schematic cross-sectional view of a semiconductor device according to a seventeenth embodiment of the present invention.

FIG. 17 is a schematic cross-sectional view of a semiconductor device 201 according to a seventeenth embodiment of the present invention. In FIG. 17, the same reference sign as in FIG. 14 is given to a component equivalent to each component shown in FIG. 14, and a description of this component is omitted.

The semiconductor device 201 according to the seventeenth embodiment includes a structure in which the barrier-forming layer 162 is disposed such that the source layer 125 is exposed from the side surface 123 of the taper trench 122 in the arrangement of FIG. 14.

More specifically, the barrier-forming layer 162 is disposed so as to selectively cover a part below the channel layer 126 of the side surface 123 of the taper trench 122. As a result, the source layer 125 and the channel layer 126 are exposed to the side surface 123 of the taper trench 122.

This arrangement makes it possible to increase the contact area of the source layer 125 with respect to the source electrode 74, and hence makes it possible to secure excellent electrical conductivity between these components.

Figure 18:
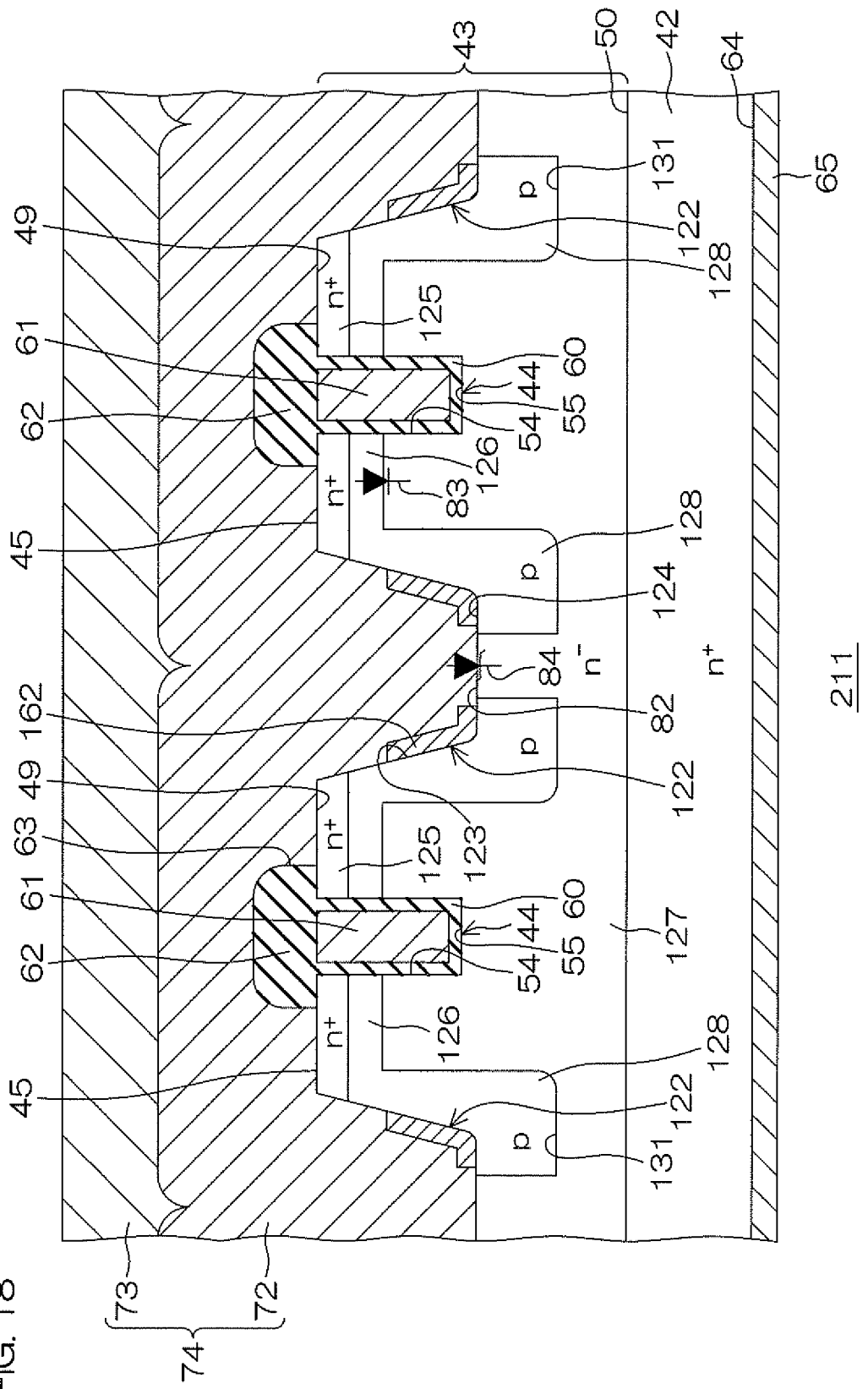
FIG. 18 is a schematic cross-sectional view of a semiconductor device according to an eighteenth embodiment of the present invention.

FIG. 18 is a schematic cross-sectional view of a semiconductor device 211 according to an eighteenth embodiment of the present invention. In FIG. 18, the same reference sign as in FIG. 15 is given to a component equivalent to each component shown in FIG. 15, and a description of this component is omitted.

The semiconductor device 211 according to the eighteenth embodiment includes a structure in which the barrier-forming layer 162 is disposed such that the source layer 125 is exposed from the side surface 123 of the taper trench 122 in the arrangement of FIG. 15.

More specifically, the barrier-forming layer 162 is disposed so as to selectively cover a part below the channel layer 126 of the side surface 123 of the taper trench 122. As a result, the source layer 125 and the channel layer 126 are exposed to the side surface 123 of the taper trench 122.

This arrangement makes it possible to increase the contact area of the source layer 125 with respect to the source electrode 74, and hence makes it possible to secure excellent electrical conductivity between these components.

Figure 19:
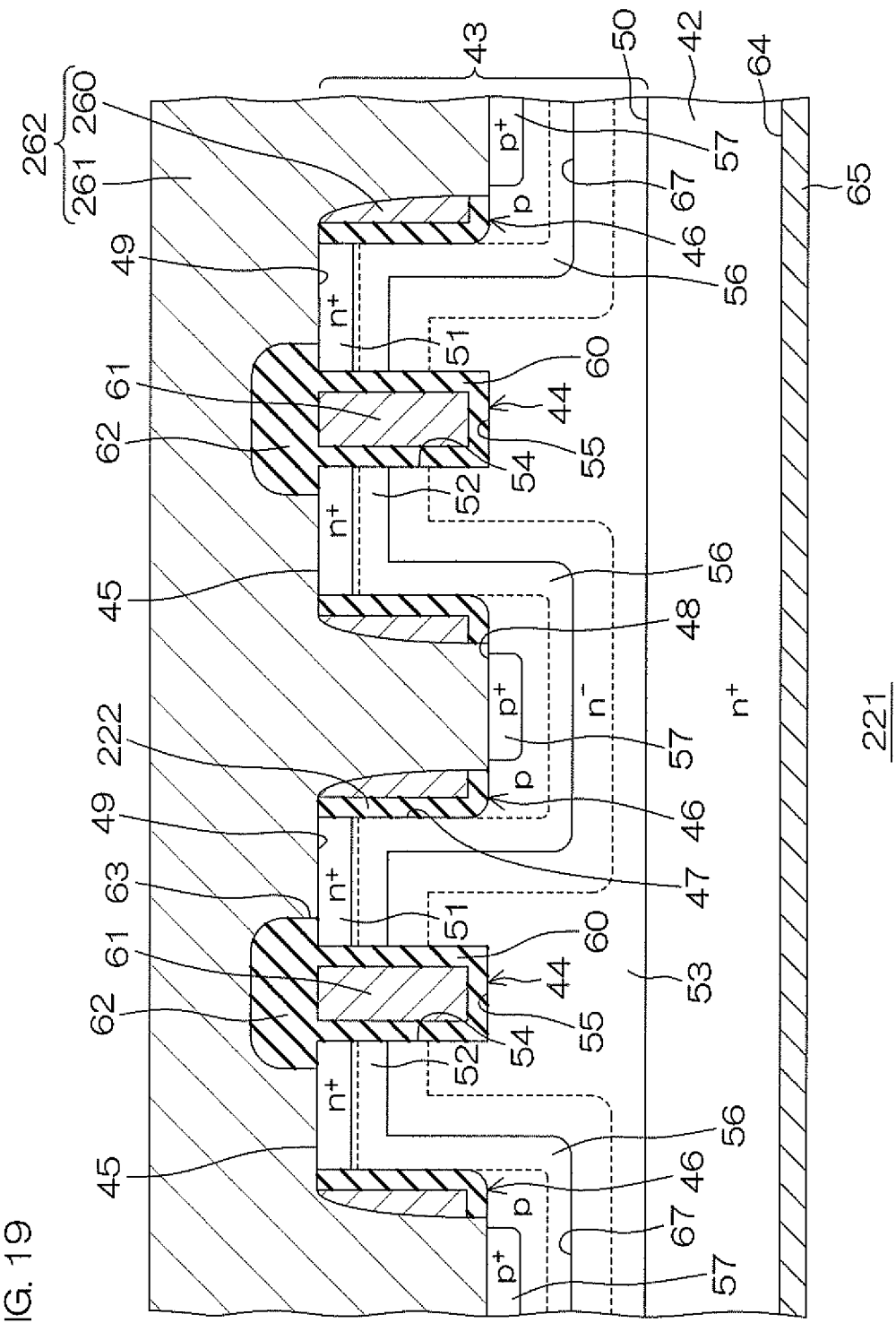
FIG. 19 is a schematic cross-sectional view of a semiconductor device according to a nineteenth embodiment of the present invention.

FIG. 19 is a schematic cross-sectional view of a semiconductor device 221 according to a nineteenth embodiment of the present invention. In FIG. 19, the same reference sign as in FIG. 4 is given to a component equivalent to each component shown in FIG. 4, and a description of this component is omitted.

The semiconductor device 221 according to the nineteenth embodiment includes, in the arrangement according to the fourth embodiment, a barrier-forming layer made of an insulating layer 222 made of any one of, for example, non-doped polysilicon, silicon oxide ($SiO_2$), aluminum oxide ($Al_2O_3$), and aluminum oxynitride (AlON).

The semiconductor device 221 includes a source electrode 262 that has a polysilicon layer 260 and a metal layer 261, instead of the source electrode 58.

The polysilicon layer 260 is stacked on the insulating layer 222 such that its one surface and the other surface extend along the insulating layer 222. As a result, an upper region of a part at which the insulating layer 222 has been selectively removed (i.e., upper region of the contact layer 57) serves as a space not occupied by the polysilicon layer 260.

The metal layer 261 is embedded in an inner region of the layered structure consisting of the insulating layer 222 and the polysilicon layer 260 in the source trench 46, and is formed flatly so as to cover the surface 49 of the SiC epitaxial layer 43 and the interlayer film 62 therewith. As a result, the source electrode 262 is connected to the contact layer 57 by means of the metal layer 261.

According to this semiconductor device 221, the layered structure consisting of the insulating layer 222 and the polysilicon layer 260 substantially functions as a barrier-forming layer that has a potential barrier higher than a potential barrier between the source breakdown voltage holding layer 56 and the source electrode 262. Therefore, it is possible to restrain punchthrough first of all by means of the insulating layer 222 even if a depletion layer spreading like the broken line of FIG. 19 by applying a reverse bias to the pn junction portion 67 reaches the side surface 47 of the source trench 46. The polysilicon layer 260 is disposed on the insulating layer 222, and therefore it is possible to restrain the depletion layer from further spreading even if the depletion layer crosses even the insulating layer 222 and reaches the source electrode 262. In other words, it is possible to restrain punchthrough by means of two stages consisting of the insulating layer 222 and the polysilicon layer 260, and therefore it is possible to excellently restrain the occurrence of a leakage current.

Additionally, it is possible to form the gate electrode 61 and the polysilicon layer 260 at the same step if the gate electrode 61 is made of polysilicon. Therefore, it is also possible to simplify a manufacturing process.

Figure 20:
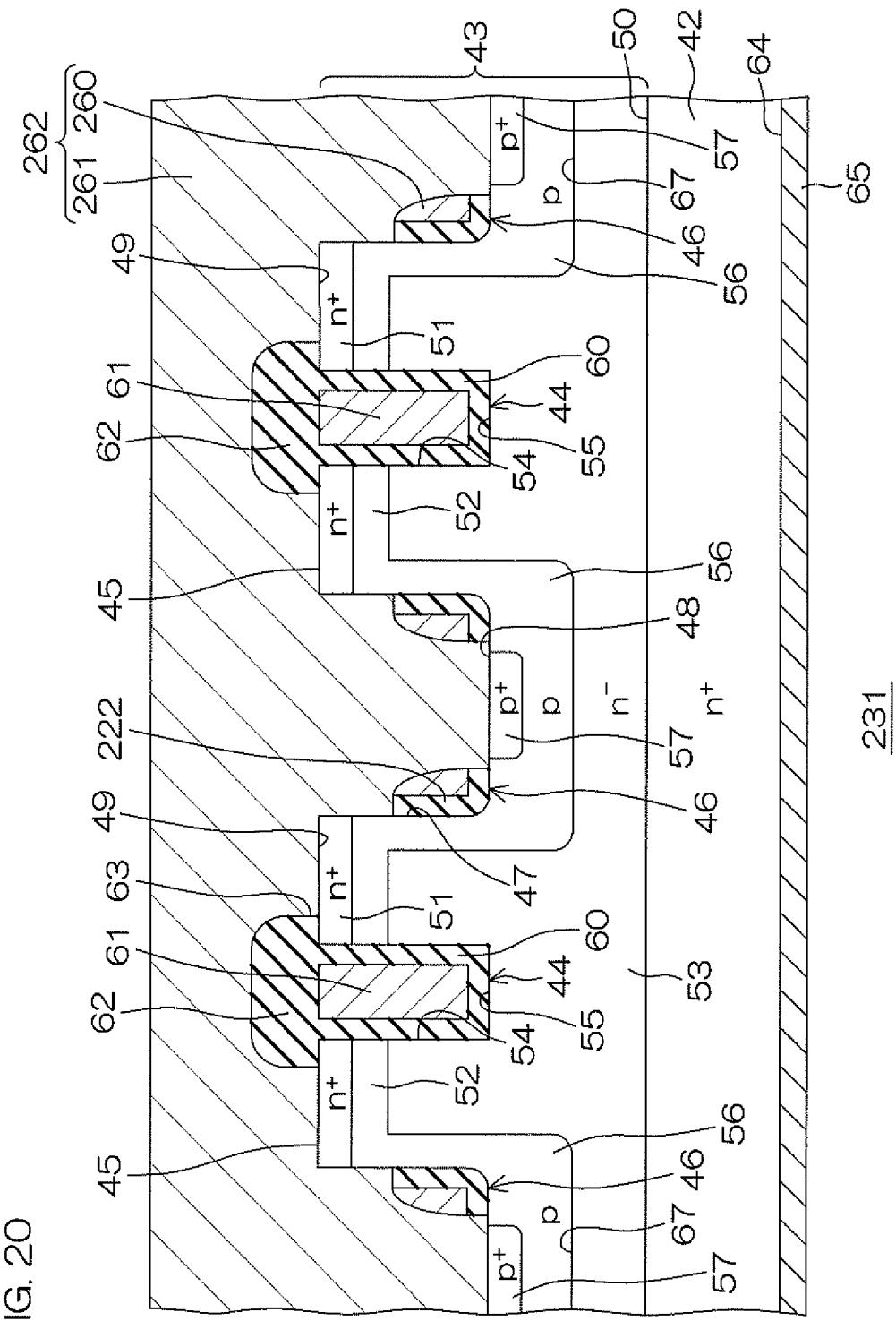
FIG. 20 is a schematic cross-sectional view of a semiconductor device according to a twentieth embodiment of the present invention.

FIG. 20 is a schematic cross-sectional view of a semiconductor device 231 according to a twentieth embodiment of the present invention. In FIG. 20, the same reference sign as in FIG. 19 is given to a component equivalent to each component shown in FIG. 19, and a description of this component is omitted.

The semiconductor device 231 according to the twentieth embodiment includes a structure in which the layered structure (barrier-forming layer) consisting of the insulating layer 222 and the polysilicon layer 260 is disposed such that the source layer 51 is exposed from the side surface 47 of the source trench 46 in the arrangement of FIG. 19.

More specifically, the insulating layer 222 is disposed so as to selectively cover a part below the channel layer 52 of the side surface 47 of the source trench 46, and the polysilicon layer 260 is stacked on the insulating layer 222. As a result, the source layer 51 and the channel layer 52 are exposed to the side surface of the source trench 46.

This arrangement makes it possible to increase the contact area of the source layer 51 with respect to the source electrode 58, and hence makes it possible to secure excellent electrical conductivity between these components.

Figure 21:
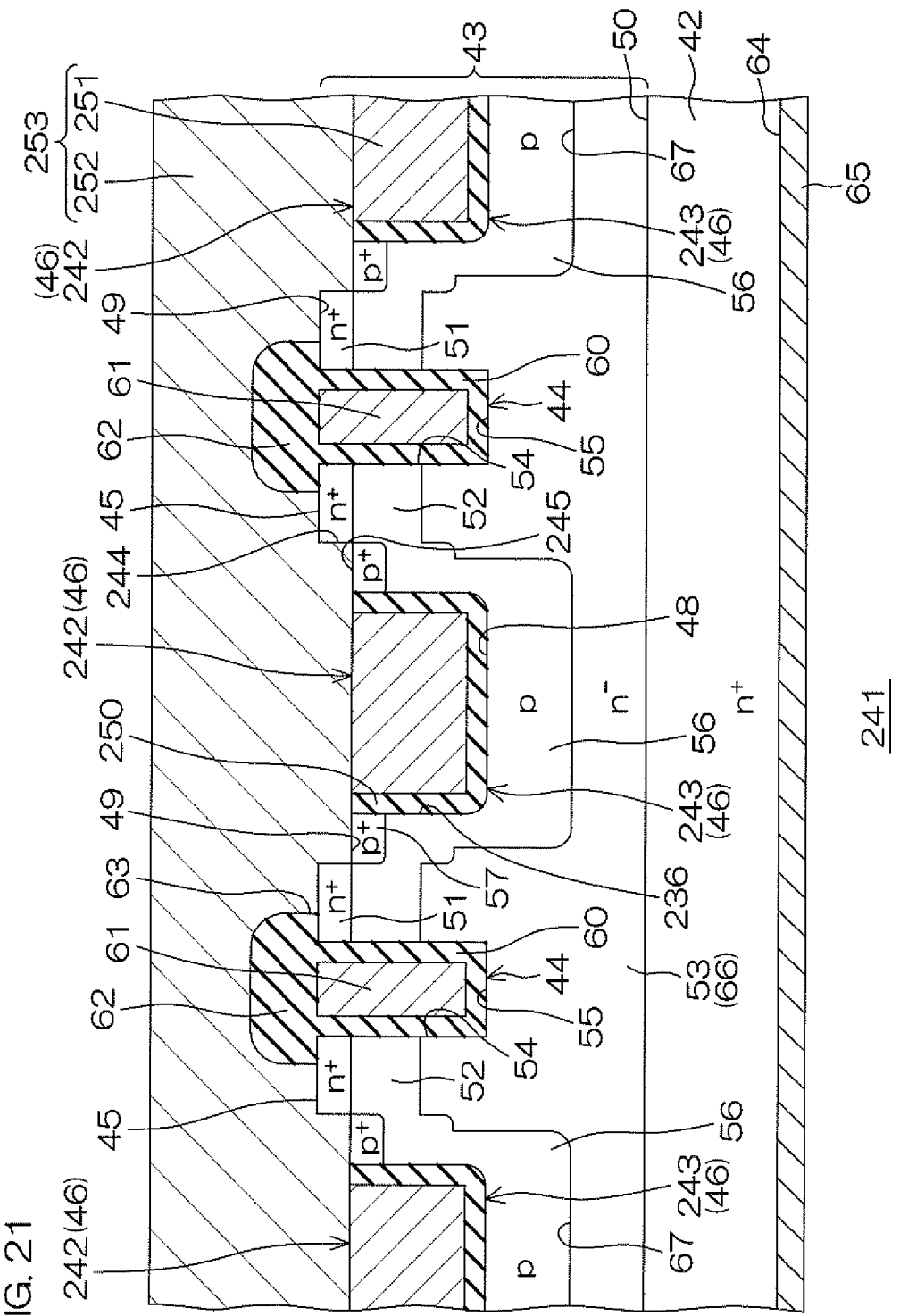
FIG. 21 is a schematic cross-sectional view of a semiconductor device according to a twenty-first embodiment of the present invention.

FIG. 21 is a schematic cross-sectional view of a semiconductor device 231 according to a twenty-first embodiment of the present invention. In FIG. 21, the same reference sign as in FIG. 19 is given to a component equivalent to each component shown in FIG. 19, and a description of this component is omitted.

As described in the fourth embodiment, the source trench 46, which has its side surface 47 having no stepped part, is flat. On the other hand, the semiconductor device 241 according to this twenty-first embodiment has the source trench 46 including an upper trench 242 having a depth ranging from the surface 49 of the SiC epitaxial layer 43 to the channel layer 52 and a lower trench 243 having a width smaller than the upper trench 242 and having a depth ranging from the channel layer 52 to the drift layer 53.

As a result, the source trench 46 has a two-stage structure in which the side surface 244 of the upper trench 242 is made outwardly wider by one stage than the side surface 236 of the lower trench 243. The channel layer 52 is annularly exposed at the stepped part between the upper trench 242 and the lower trench 243, and the contact layer 57 is formed at the exposed part.

The semiconductor device 231 includes an insulating layer 250 with which the whole of the inner surface (bottom surface and side surface) of the lower trench 243 is covered, instead of the insulating layer 222. More specifically, the insulating layer 250 is formed such that its one surface and the other surface extend along the inner surface of the lower trench 243. As a result, the inner region of the lower trench 243 serves as a space not occupied by the insulating layer 250. The insulating layer 250 is made of any one of, for example, non-doped polysilicon, silicon oxide ($SiO_2$), aluminum oxide ($Al_2O_3$), and aluminum oxynitride (AlON).

The semiconductor device 241 includes a source electrode 253 that has a polysilicon layer 251 and a metal layer 252, instead of the source electrode 58.

The polysilicon layer 251 is embedded in an inner region of the insulating layer 250 in the lower trench 243, and has an upper surface that is flush with the bottom surface 245 of the upper trench 242.

The metal layer 252 is embedded in the upper trench 242 by being stacked on the polysilicon layer 251, and is formed so as to cover the surface 49 of the SiC epitaxial layer 43 and the interlayer film 62. As a result, the source electrode 253 is connected to the contact layer 57 through the metal layer 252.

According to this semiconductor device 241, it is only necessary to embed the polysilicon layer 251 in the source trench 46, and therefore it is possible to easily form the polysilicon layer 251. Additionally, the polysilicon layer 251 is formed so as to backfill the lower trench 243, and therefore it is possible to reduce an apparent difference in height between the bottom surface of the source trench 46 (the upper surface of the polysilicon layer 251) and the surface 49 of the SiC epitaxial layer 43. Therefore, it is possible to smooth or flatten the surface of the source electrode 58.

Additionally, it is possible to form the gate electrode 61 and the polysilicon layer 251 at the same step if the gate electrode 61 is made of polysilicon. Therefore, it is also possible to simplify a manufacturing process.

The present invention can be embodied in other modes although the embodiments of the present invention have been described above.

For example, an arrangement in which the conductivity type of each semiconductor part of each semiconductor device mentioned above is reversed may be employed. For example, in the semiconductor device 1 and so on, the p type part may be an n type, and the n type part may be a p type.

The semiconductor device of the present invention is capable of being incorporated into a power module for use in an inverter circuit forming a driving circuit to drive an electric motor that is used as a power source of, for example, an electric automobile (including a hybrid automobile), a train, or an industrial robot. Additionally, the semiconductor device of the present invention is also capable of being incorporated into a power module for use in an inverter circuit that converts electric power generated by a solar battery, by a wind generator, or by other power generators (particularly, a private electric generator) so as to match the electric power of a commercial power source.

Additionally, it is possible to combine features grasped from the disclosures of the aforementioned embodiments together among different embodiments. Additionally, it is possible to combine the components shown in each embodiment together within the scope of the present invention.

The embodiments of the present invention are merely concrete examples used to clarify the technical contents of the present invention, and the present invention should not be understood by being limited to these concrete examples, and the spirit and scope of the present invention are limited solely by the appended claims.

The present application corresponds to Japanese Patent Application No. 2012-181897 filed in the Japan Patent Office on Aug. 20, 2012, and the entire disclosure of the application is incorporated herein by reference.

REFERENCE SIGNS LIST

1 Semiconductor device
2 SiC substrate
3 SiC epitaxial layer
4 Surface
5 Side surface
6 Bottom surface 7 Trench
8 P type layer
9 Back surface
10 N⁻ type layer
11 Interface
12 P⁺ type contact layer
13 Back-surface electrode
14 Surface electrode
15 Barrier-forming layer
16 Pn junction portion
21 Semiconductor device
22 Taper trench
23 Side surface
24 Bottom surface
25 P type layer
26 P⁺ type contact layer
27 Pn junction portion
28 Barrier-forming layer
31 Semiconductor device
41 Semiconductor device
42 SiC substrate
43 SiC epitaxial layer
44 Gate trench
45 Unit cell
46 Source trench
47 Side surface
48 Bottom surface
49 Surface
50 Back surface
51 Source layer
52 Channel layer
53 Drift layer
54 Side surface
55 Bottom surface
56 Source breakdown voltage holding layer
57 Contact layer
58 Source electrode
59 Barrier-forming layer
60 Gate insulating film
61 Gate electrode
62 Interlayer film
63 Contact hole
64 Back surface
65 Drain electrode
67 Pn junction portion
71 Semiconductor device
72 Polysilicon layer
73 Metal layer
74 Source electrode
81 Semiconductor device
82 Heterojunction portion
83 Body diode
84 Heterojunction diode
91 Semiconductor device
101 Semiconductor device
111 Semiconductor device
121 Semiconductor device
122 Taper trench
123 Side surface
124 Bottom surface
125 Source layer
126 Channel layer
127 Drift layer
128 Source breakdown voltage holding layer
129 Contact layer
130 Drain layer
131 Pn junction portion
141 Semiconductor device
151 Semiconductor device
161 Semiconductor device
162 Barrier-forming layer
171 Semiconductor device
181 Semiconductor device
191 Semiconductor device
201 Semiconductor device
211 Semiconductor device
221 Semiconductor device
222 Insulating layer
231 Semiconductor device
236 Side surface
241 Semiconductor device
242 Upper trench
243 Lower trench
244 Side surface
245 Bottom surface
250 Insulating layer
251 Polysilicon layer
252 Metal layer
253 Source electrode
260 Polysilicon layer
261 Metal layer
262 Source electrode

What is claimed is:

1. A semiconductor device comprising:
a semiconductor layer in which a gate trench having a side surface and a bottom surface and a source trench having a side surface and a bottom surface are formed;
a first conductivity type source layer that is disposed so as to be exposed on a surface of the semiconductor layer and that defines the side surface of the gate trench and the side surface of the source trench;
a second conductivity type channel layer that is disposed so as to be contiguous to the source layer on a back surface side of the semiconductor layer with respect to the source layer and that defines a part of the side surface of the gate trench and a part of the side surface of the source trench;
a first conductivity type drain layer that is disposed so as to be contiguous to the channel layer on the back surface side of the semiconductor layer with respect to the channel layer and that defines the bottom surface of the gate trench and the bottom surface of the source trench;
a gate electrode embedded in the gate trench;
a gate insulating film disposed between the side and bottom surfaces of the gate trench and the gate electrode;
a second conductivity type source breakdown voltage holding layer that is formed so as to be continuous with the channel layer and that is disposed on the side surface and the bottom surface of the source trench;
a drain electrode electrically connected to the drain layer;
a source electrode that is embedded in the source trench and that is electrically connected to the source layer and to the source breakdown voltage holding layer; and
a barrier-forming layer that is disposed between the side surface of the source trench and the source electrode and that has a potential barrier higher than a potential barrier between the source breakdown voltage holding layer and the source electrode.

2. The semiconductor device according to claim 1, wherein the barrier-forming layer is further disposed on an edge portion of the bottom surface of the source trench.

3. The semiconductor device according to claim 1, wherein the barrier-forming layer is disposed such that the source layer is exposed from the side surface of the source trench.

4. The semiconductor device according to claim 1, wherein the barrier-forming layer includes a metal layer made of any one of tungsten (W), platinum (Pt), nickel (Ni), cobalt (Co), and molybdenum (Mo).

5. The semiconductor device according to claim 1, wherein the barrier-forming layer includes a first conductivity type polysilicon layer.

6. The semiconductor device according to claim 1, wherein the barrier-forming layer includes an insulating layer made of any one of non-doped polysilicon, silicon oxide ($SiO_2$), aluminum oxide ($Al_2O_3$), and aluminum oxynitride (AlON).

7. A semiconductor device comprising:
   a semiconductor layer in which a gate trench having a side surface and a bottom surface and a source trench having a side surface and a bottom surface are formed, the source trench being a taper trench whose side surface is inclined with respect to the bottom surface at an obtuse angle;
   a first conductivity type source layer that is disposed so as to be exposed on a surface of the semiconductor layer and that defines the side surface of the gate trench and the side surface of the source trench;
   a second conductivity type channel layer that is disposed so as to be contiguous to the source layer on a back surface side of the semiconductor layer with respect to the source layer and that defines a part of the side surface of the gate trench and a part of the side surface of the source trench;
   a first conductivity type drain layer that is disposed so as to be contiguous to the channel layer on the back surface side of the semiconductor layer with respect to the channel layer and that defines the bottom surface of the gate trench and the bottom surface of the source trench;
   a gate electrode embedded in the gate trench;
   a gate insulating film disposed between the side and bottom surfaces of the gate trench and the gate electrode;
   a second conductivity type source breakdown voltage holding layer that is disposed on the side surface and the bottom surface of the source trench so as to be continuous with the channel layer and that becomes thicker in a lateral direction along the surface of the semiconductor layer from the side surface corresponding to an inclination of the side surface of the source trench;
   a drain electrode electrically connected to the drain layer; and
   a source electrode that is embedded in the source trench and that is electrically connected to the source layer and to the source breakdown voltage holding layer.

8. The semiconductor device according to claim 7, further comprising a barrier-forming layer that is disposed between the side surface of the source trench and the source electrode and that forms a potential barrier between the barrier-forming layer and the source breakdown voltage holding layer higher than a potential barrier between the source breakdown voltage holding layer and the source electrode.

9. The semiconductor device according to claim 8, wherein the barrier-forming layer is further disposed on an edge portion of the bottom surface of the source trench.

10. The semiconductor device according to claim 8, wherein the barrier-forming layer is disposed such that the source layer is exposed from the side surface of the source trench.

11. The semiconductor device according to claim 8, wherein the barrier-forming layer includes a metal layer made of any one of tungsten (W), platinum (Pt), nickel (Ni), cobalt (Co), and molybdenum (Mo).

12. The semiconductor device according to claim 8, wherein the barrier-forming layer includes a first conductivity type polysilicon layer.

13. The semiconductor device according to claim 8, wherein the barrier-forming layer includes an insulating layer made of any one of non-doped polysilicon, silicon oxide ($SiO_2$), aluminum oxide ($Al_2O_3$), and aluminum oxynitride (AlON).

14. A semiconductor device comprising:
   a semiconductor layer in which a gate trench having a side surface and a bottom surface and a source trench having a side surface and a bottom surface are formed;
   a first conductivity type source layer that is disposed so as to be exposed on a surface of the semiconductor layer and that defines the side surface of the gate trench and the side surface of the source trench;
   a second conductivity type channel layer that is disposed so as to be contiguous to the source layer on a back surface side of the semiconductor layer with respect to the source layer and that defines a part of the side surface of the gate trench and a part of the side surface of the source trench;
   a first conductivity type drain layer that is disposed so as to be contiguous to the channel layer on the back surface side of the semiconductor layer with respect to the channel layer and that defines the bottom surface of the gate trench and the bottom surface of the source trench;
   a gate electrode that is embedded in the gate trench and that is made of polysilicon;
   a gate insulating film disposed between the side and bottom surfaces of the gate trench and the gate electrode;
   a second conductivity type source breakdown voltage holding layer that is formed so as to be continuous with the channel layer and that is disposed on the side surface and the bottom surface of the source trench;
   an insulating layer disposed on the side surface of the source trench and an edge portion of the bottom surface of the source trench;
   a drain electrode electrically connected to the drain layer; and
   a source electrode that is embedded in the source trench and that is electrically connected to the source layer and to the source breakdown voltage holding layer, the source electrode having a polysilicon layer at least on the insulating layer.

15. The semiconductor device according to claim 14, wherein the insulating layer is disposed such that the source layer is exposed from the side surface of the source trench.

16. The semiconductor device according to claim 14, wherein the polysilicon layer is embedded in a region inside the insulating layer in the source trench, and
   the source electrode includes a metal layer stacked on the polysilicon layer embedded in the region.

* * * * *